US010818585B2

United States Patent
Terasaki

(10) Patent No.: US 10,818,585 B2
(45) Date of Patent: Oct. 27, 2020

(54) COPPER/CERAMIC JOINED BODY, INSULATED CIRCUIT BOARD, METHOD FOR PRODUCING COPPER/CERAMIC JOINED BODY, AND METHOD FOR PRODUCING INSULATED CIRCUIT BOARD

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/486,266

(22) PCT Filed: Feb. 27, 2018

(86) PCT No.: PCT/JP2018/007186
§ 371 (c)(1),
(2) Date: Aug. 15, 2019

(87) PCT Pub. No.: WO2018/159590
PCT Pub. Date: Sep. 7, 2018

(65) Prior Publication Data
US 2020/0006213 A1    Jan. 2, 2020

(30) Foreign Application Priority Data

Feb. 28, 2017  (JP) .................................. 2017-036841
Jan. 25, 2018  (JP) .................................. 2018-010964

(51) Int. Cl.
*B32B 15/04* (2006.01)
*H01L 23/498* (2006.01)
(Continued)

(52) U.S. Cl.
CPC ...... *H01L 23/49822* (2013.01); *C04B 37/023* (2013.01); *H01L 21/4857* (2013.01);
(Continued)

(58) Field of Classification Search
None
See application file for complete search history.

(56) References Cited

U.S. PATENT DOCUMENTS

| 6,020,076 A * | 2/2000 | Fujii ..................... C04B 37/026 |
| | | 428/621 |
| 6,106,960 A | 8/2000 | Fujii et al. |
| 2016/0016245 A1* | 1/2016 | Terasaki ............... B23K 1/0016 |
| | | 228/123.1 |

FOREIGN PATENT DOCUMENTS

| JP | 04-162756 A | 6/1992 |
| JP | 08-277171 A | 10/1996 |

(Continued)

OTHER PUBLICATIONS

International Search Report dated Apr. 10, 2018, issued for PCT/JP2018/007186 and English translation thereof.

*Primary Examiner* — Seth Dumbris
(74) *Attorney, Agent, or Firm* — Locke Lord LLP

(57) ABSTRACT

There is provided a copper/ceramic bonded body of the present invention in which a copper member made of copper or a copper alloy and a ceramic member made of aluminum nitride or silicon nitride are bonded to each other, in which an active metal nitride layer containing a nitride of one or more active metals selected from Ti, Zr, Nb, and Hf is formed on the ceramic member side between the copper member and the ceramic member, a Mg solid solution layer in which Mg is dissolved in a Cu matrix phase is formed between the active metal nitride layer and the copper member, and the active metal is present in the Mg solid solution layer.

20 Claims, 9 Drawing Sheets

(51) Int. Cl.
*C04B 37/02* (2006.01)
*H01L 21/48* (2006.01)
*H01L 23/15* (2006.01)
H01L 23/367 (2006.01)
H01L 23/373 (2006.01)
H01L 23/00 (2006.01)

(52) U.S. Cl.
CPC ........ *H01L 23/15* (2013.01); *H01L 23/49866* (2013.01); *C04B 2237/08* (2013.01); *C04B 2237/127* (2013.01); *C04B 2237/366* (2013.01); *C04B 2237/368* (2013.01); *C04B 2237/407* (2013.01); *C04B 2237/60* (2013.01); *C04B 2237/86* (2013.01); *H01L 21/4882* (2013.01); *H01L 23/3675* (2013.01); *H01L 23/3735* (2013.01); *H01L 24/32* (2013.01); *H01L 24/83* (2013.01); *H01L 2224/32225* (2013.01); *H01L 2224/83801* (2013.01); *Y10T 428/12576* (2015.01)

(56) References Cited

FOREIGN PATENT DOCUMENTS

| | | |
|---|---|---|
| JP | 08-277173 A | 10/1996 |
| JP | 2001-077245 A | 3/2001 |
| JP | 2001-135929 A | 5/2001 |
| JP | 3211856 B2 | 9/2001 |
| JP | 2007-197229 A | 8/2007 |
| JP | 4375730 B2 | 12/2009 |
| JP | 2014-168811 A | 9/2014 |
| WO | 2015/141839 A1 | 9/2015 |

\* cited by examiner

US 10,818,585 B2

COPPER/CERAMIC JOINED BODY, INSULATED CIRCUIT BOARD, METHOD FOR PRODUCING COPPER/CERAMIC JOINED BODY, AND METHOD FOR PRODUCING INSULATED CIRCUIT BOARD

TECHNICAL FIELD

This invention relates to a copper/ceramic bonded body in which a copper member made of copper or a copper alloy and a ceramic member made of aluminum nitride or silicon nitride are bonded to each other, an insulating circuit substrate, a method for producing a copper/ceramic bonded body, and a method for producing an insulating circuit substrate.

Priority is claimed on Japanese Patent Application No. 2017-036841, filed on Feb. 28, 2017, and Japanese Patent Application No. 2018-010964, filed on Jan. 25, 2018, the contents of which are incorporated herein by reference.

BACKGROUND ART

A power module, an LED module, and a thermoelectric module have a structure in which a power semiconductor element, an LED element, and a thermoelectric element are bonded to an insulating circuit substrate in which a circuit layer made of a conductive material is formed on one surface of an insulating layer.

For example, a power semiconductor element for large power control, which is used to control wind power generation, an electric vehicle, a hybrid vehicle, and the like, generates a large amount of heat during operation. Therefore, as a substrate having a power semiconductor element mounted thereon, for example, an insulating circuit substrate provided with a ceramic substrate made of aluminum nitride, silicon nitride, or the like, and a circuit layer formed by bonding a metal plate having excellent conductivity to one surface of the ceramic substrate has been widely used in the related art. As an insulating circuit substrate, one having a metal layer formed by bonding a metal plate to the other surface of the ceramic substrate is also provided.

For example, Patent Document 1 proposes an insulating circuit substrate in which a first metal plate and a second metal plate respectively constituting a circuit layer and a metal layer are formed of a copper plate, and the copper plates are directly bonded to a ceramic substrate by a DBC method. In the DBC method, the copper plates and the ceramic substrate are bonded by generating a liquid phase at the interfaces between the copper plates and the ceramic substrate using a eutectic reaction of copper and copper oxides.

Patent Document 2 proposes an insulating circuit substrate in which a circuit layer and a metal layer are formed by bonding copper plates to one surface and the other surface of a ceramic substrate. In the insulating circuit substrate, the copper plates are disposed on one surface and the other surface of the ceramic substrate with an Ag—Cu—Ti-based brazing material interposed therebetween, and the copper plates are bonded thereto by performing a heating treatment (so-called active metal brazing method). In the active metal brazing method, since the brazing material containing Ti as an active metal is used, the wettability between the molten brazing material and the ceramic substrate is improved, and the ceramic substrate and the copper plates are reliably bonded to each other.

Patent Document 3 proposes, as a brazing material for bonding, which is used when a copper plate and a ceramic substrate are bonded to each other in a high temperature nitrogen gas atmosphere, a paste containing a powder made of a Cu—Mg—Ti alloy. In Patent Document 3, a configuration in which bonding is achieved by heating at 560° C. to 800° C. in a nitrogen gas atmosphere is provided, and Mg in the Cu—Mg—Ti alloy sublimates and does not remain at the bonding interface, while titanium nitride (TiN) is not substantially formed.

CITATION LIST

Patent Literature

[Patent Document 1] Japanese Unexamined Patent Application, First Publication No. H04-162756
[Patent Document 2] Japanese Patent No. 3211856
[Patent Document 3] Japanese Patent No. 4375730

SUMMARY OF INVENTION

Technical Problem

However, as disclosed in Patent Document 1, in a case where the ceramic substrate and the copper plates are bonded according to the DBC method, the bonding temperature needs to be set to 1065° C. or higher (the eutectic point temperature of copper and copper oxides or higher), so that there is concern that the ceramic substrate may deteriorate during bonding.

As disclosed in Patent Document 2, in a case of bonding the ceramic substrate and the copper plates according to the active metal brazing method, since the brazing material contains Ag and Ag is present at the bonding interface, migration easily occurs, and use for high voltage applications cannot be achieved. In addition, since the bonding temperature is relatively as high as 900° C., there is also a problem that the ceramic substrate may deteriorate.

As disclosed in Patent Document 3, in a case where bonding is performed in a nitrogen gas atmosphere using a brazing material for bonding, which is formed of the paste containing a powder made of a Cu—Mg—Ti alloy, gas remains at the bonding interface, and there is a problem that partial discharge easily occurs. In addition, since the alloy powder is used, the molten state becomes uneven depending on the composition variation of the alloy powder, and there is concern that a region with an insufficient interfacial reaction may be locally formed. Furthermore, there is concern that organic matter contained in the paste remains at the bonding interface and may result in insufficient bonding.

This invention has been made in view of the above-described circumstances, and an object thereof is to provide a copper/ceramic bonded body in which a copper member and a ceramic member are reliably bonded to each other and excellent migration resistance is achieved, an insulating circuit substrate, a method for producing the copper/ceramic bonded body, and a method for producing an insulating circuit substrate.

Solution to Problem

In order to solve these problems and achieve the above-mentioned object, an aspect of the present invention includes a copper/ceramic bonded body in which a copper member made of copper or a copper alloy and a ceramic member made of aluminum nitride or silicon nitride are bonded to each other, in which an active metal nitride layer containing a nitride of one or more active metals selected from Ti, Zr, Nb, and Hf is formed on the ceramic member side between the copper member and the ceramic member, a Mg solid solution layer in which Mg is dissolved in a Cu matrix phase is formed between the active metal nitride layer and the copper member, and the active metal is present in the Mg solid solution layer.

In the copper/ceramic bonded body having the configuration, the active metal nitride layer containing a nitride of one or more active metals selected from Ti, Zr, Nb, and Hf is formed on the ceramic member side between the copper member made of copper or a copper alloy and the ceramic member made of aluminum nitride or silicon nitride. The active metal nitride layer is formed by the reaction between the active metal disposed between the ceramic member and the copper member and nitrogen of the ceramic member, and thus the ceramic member sufficiently reacts.

The Mg solid solution layer in which Mg is dissolved in the Cu matrix phase is formed between the active metal nitride layer and the copper member and the active metal is present in the Mg solid solution layer, so that Mg disposed between the ceramic member and the copper member is sufficiently diffused on the copper member side and furthermore, Cu and the active metal are sufficiently reacted to each other.

Therefore, the copper/ceramic bonded body in which the interfacial reaction sufficiently proceeds at the bonding interface between the copper member and the ceramic member and the copper member and the ceramic member are reliably bonded to each other can be obtained. In addition, since Ag is not present at the bonding interface, excellent migration resistance is also achieved.

In the copper/ceramic bonded body according to the aspect of the present invention, an intermetallic compound phase containing Cu and the active metal may be dispersed in the Mg solid solution layer.

In a case where Ti, Zr, and Hf are contained as the active metal, the active metal in the Mg solid solution layer is present as the intermetallic compound phase of Cu and the active metal. Therefore, since the intermetallic compound phase of Cu and the active metal is present in the Mg solid solution layer, Mg disposed between the ceramic member and the copper member is sufficiently diffused on the copper member side and Cu and the active metal are sufficiently reacted to each other. Therefore, the copper/ceramic bonded body in which the copper member and the ceramic member are reliably bonded to each other can be obtained.

In the copper/ceramic bonded body according to the aspect of the present invention, it is preferable that Cu particles are dispersed in the active metal nitride layer.

In this case, Cu of the copper member and the ceramic member are sufficiently reacted to each other, so that it becomes possible to obtain the copper/ceramic bonded body in which the copper member and the ceramic member are firmly bonded to each other. The Cu particles are Cu simple substance or an intermetallic compound containing Cu, and are formed by the precipitation of Cu present in a liquid phase when the active metal nitride layer is formed.

In the copper/ceramic bonded body according to the aspect of the present invention, the active metal may be Ti.

In this case, a titanium nitride layer is formed as the active metal nitride layer, the intermetallic compound phase containing Cu and Ti is dispersed in the Mg solid solution layer, and the copper member and the ceramic member are reliably bonded to each other, so that the copper/ceramic bonded body having excellent migration resistance can be provided.

In the copper/ceramic bonded body according to the aspect of the present invention, it is preferable that in a region from a bonding surface of the ceramic member to 50 μm toward the copper member side between the ceramic member and the copper member, an area ratio of a $Cu_2Mg$ phase is 15% or less.

In this case, since the area ratio of the $Cu_2Mg$ phase which is brittle is limited to 15% or less, for example, even in a case where ultrasonic bonding or the like is performed, it becomes possible to limit the occurrence of cracking or the like at the bonding interface.

Another aspect of the present invention includes an insulating circuit substrate in which a copper plate made of copper or a copper alloy is bonded to a surface of a ceramic substrate made of aluminum nitride or silicon nitride, in which an active metal nitride layer containing a nitride of one or more active metals selected from Ti, Zr, Nb, and Hf is formed on the ceramic substrate side between the copper plate and the ceramic substrate, a Mg solid solution layer in which Mg is dissolved in a Cu matrix phase is formed between the active metal nitride layer and the copper plate, and the active metal is present in the Mg solid solution layer.

In the insulating circuit substrate having the configuration, the copper plate and the ceramic substrate are reliably bonded to each other, and excellent migration resistance is achieved, so that the insulating circuit substrate can be used with high reliability even under high pressure conditions.

In the insulating circuit substrate according to the aspect of the present invention, an intermetallic compound phase containing Cu and the active metal may be dispersed in the Mg solid solution layer.

In a case where Ti, Zr, and Hf are contained as the active metal, the active metal in the Mg solid solution layer is present as the intermetallic compound phase of Cu and the active metal. Therefore, since the intermetallic compound phase of Cu and the active metal is present in the Mg solid solution layer, the insulating circuit substrate in which the copper plate and the ceramic substrate are reliably bonded to each other can be obtained.

In the insulating circuit substrate according to the aspect of the present invention, it is preferable that Cu particles are dispersed in the active metal nitride layer.

In this case, Cu of the copper plate and the ceramic substrate are sufficiently reacted to each other, so that it becomes possible to obtain the insulating circuit substrate in which the copper plate and the ceramic substrate are firmly bonded to each other. The Cu particles are Cu simple substance or an intermetallic compound containing Cu, and are formed by the precipitation of Cu present in a liquid phase when the active metal nitride layer is formed.

In the insulating circuit substrate according to the aspect of the present invention, the active metal may be Ti.

In this case, a titanium nitride layer is formed as the active metal nitride layer, the intermetallic compound phase containing Cu and Ti is dispersed in the Mg solid solution layer, and the copper plate and the ceramic substrate are reliably bonded to each other, so that the insulating circuit substrate having excellent migration resistance can be provided.

In the insulating circuit substrate according to the aspect of the present invention, it is preferable that in a region from a bonding surface of the ceramic substrate to 50 μm toward the copper plate side between the ceramic substrate and the copper plate, an area ratio of a $Cu_2Mg$ phase is 15% or less.

In this case, since the area ratio of the $Cu_2Mg$ phase which is brittle is limited to 15% or less, for example, even in a case where ultrasonic bonding is performed, it becomes possible to limit the occurrence of cracking or the like at the bonding interface.

A method for producing a copper/ceramic bonded body according to still another aspect of the present invention is a method for producing the above-described copper/ceramic bonded body, and includes: an active metal and Mg disposing step of disposing a simple substance of one or more active metals selected from Ti, Zr, Nb, and Hf and a Mg simple substance between the copper member and the ceramic member; a laminating step of laminating the copper member and the ceramic member with the active metal and Mg interposed therebetween; and a bonding step of performing a heating treatment on the copper member and the ceramic member laminated with the active metal and Mg interposed therebetween in a state of being pressed in a laminating direction under a vacuum atmosphere so as to bond the copper member and the ceramic member to each other, in which, in the active metal and Mg disposing step, an amount of the active metal is in a range of 0.4 $\mu mol/cm^2$ or more and 47.0 $\mu mol/cm^2$ or less, and an amount of Mg is in a range of 7.0 $\mu mol/cm^2$ or more and 143.2 $\mu mol/cm^2$ or less.

According to the method for producing a copper/ceramic bonded body having the above configuration, since the simple substance of the active metal and the Mg simple substance are disposed between the copper member and the ceramic member and are subjected to the heating treatment in a state of being pressed in the laminating direction under the vacuum atmosphere, no gas or residue of organic matter remains at the bonding interface. In addition, since the simple substance of the active metal and the Mg simple substance are disposed, the composition does not vary and a uniform liquid phase is generated.

In the active metal and Mg disposing step, since the amount of the active metal is in a range of 0.4 $\mu mol/cm^2$ or more and 47.0 $\mu mol/cm^2$ or less, and the amount of Mg is in a range of 7.0 $\mu mol/cm^2$ or more and 143.2 $\mu mol/cm^2$ or less, a liquid phase necessary for the interfacial reaction can be sufficiently obtained, and an excessive reaction of the ceramic member can be limited.

Therefore, the copper/ceramic bonded body in which the copper member and the ceramic member are reliably bonded to each other can be obtained. In addition, since Ag is not used for bonding, the copper/ceramic bonded body excellent in migration resistance can be obtained.

In the method for producing a copper/ceramic bonded body according to the aspect of the present invention, it is preferable that a pressing load in the bonding step is in a range of 0.049 MPa or more and 3.4 MPa or less, and a heating temperature in the bonding step is in a range of 500° C. or higher and 850° C. or lower in a case where Cu and Mg are laminated in a contact state and is in a range of 670° C. or higher and 850° C. or lower in a case where Cu and Mg are laminated in a non-contact state.

In this case, since the pressing load in the bonding step is in a range of 0.049 MPa or more and 3.4 MPa or less, the ceramic member, the copper member, the active metal, and Mg can be brought into close contact, so that the interfacial reactions therebetween during heating can be promoted.

Since the heating temperature in the bonding step is equal to or higher than 500° C., which is higher than the eutectic temperature of Cu and Mg in a case where Cu and Mg are laminated in a contact state and is equal to or higher than 670° C., which is higher than the melting point Mg in a case where Cu and Mg are laminated in a non-contact state, a liquid phase can be sufficiently generated at the bonding interface.

Since the heating temperature in the bonding step is 850° C. or less, the occurrence of the eutectic reaction between Cu and the active metal can be limited, and the excessive generation of the liquid phase can be limited. Furthermore, the thermal load on the ceramic member is reduced, so that the deterioration of the ceramic member can be limited.

A method for producing an insulating circuit substrate according to still another aspect of the present invention is a method for producing an insulating circuit substrate in which a copper plate made of copper or a copper alloy is bonded to a surface of a ceramic substrate made of aluminum nitride or silicon nitride, and includes: an active metal and Mg disposing step of disposing a simple substance of one or more active metals selected from Ti, Zr, Nb, and Hf and a Mg simple substance between the copper plate and the ceramic substrate; a laminating step of laminating the copper plate and the ceramic substrate with the active metal and Mg interposed therebetween; and a bonding step of performing a heating treatment on the copper plate and the ceramic substrate laminated with the active metal and Mg interposed therebetween in a state of being pressed in a laminating direction under a vacuum atmosphere so as to bond the copper plate and the ceramic substrate to each other, in which in the active metal and Mg disposing step, an amount of the active metal is in a range of 0.4 $\mu mol/cm^2$ or more and 47.0 $\mu mol/cm^2$ or less, and an amount of Mg is in a range of 7.0 $\mu mol/cm^2$ or more and 143.2 $\mu mol/cm^2$ or less.

According to the method for producing an insulating circuit substrate having the configuration, the insulating circuit substrate in which the copper plate and the ceramic substrate are reliably bonded to each other can be obtained. In addition, since Ag is not used for bonding, the insulating circuit substrate excellent in migration resistance can be obtained.

In the method for producing an insulating circuit substrate according to the aspect of the present invention, it is preferable that a pressing load in the bonding step is in a range of 0.049 MPa or more and 3.4 MPa or less, and a heating temperature in the bonding step is in a range of 500° C. or higher and 850° C. or lower in a case where Cu and Mg are laminated in a contact state and is in a range of 670° C. or higher and 850° C. or lower in a case where Cu and Mg are laminated in a non-contact state.

In this case, since the pressing load in the bonding step is in a range of 0.049 MPa or more and 3.4 MPa or less, the ceramic substrate, the copper plate, the active metal, and Mg can be brought into close contact, so that the interfacial reactions therebetween during heating can be promoted.

Since the heating temperature in the bonding step is equal to or higher than 500° C., which is higher than the eutectic temperature of Cu and Mg in a case where Cu and Mg are laminated in a contact state and is equal to or higher than 670° C., which is higher than the inciting point Mg in a case where Cu and Mg are laminated in a non-contact state, a liquid phase can be sufficiently generated at the bonding interface.

Since the heating temperature in the bonding step is 850° C. or less, the occurrence of the eutectic reaction between Cu and the active metal can be limited, and the excessive generation of the liquid phase can be limited. Furthermore, the thermal load on the ceramic substrate is reduced, so that the deterioration of the ceramic substrate can be limited.

Advantageous Effects of Invention

According to the present invention, it becomes possible to provide the copper/ceramic bonded body in which the copper member and the ceramic member are reliably bonded to each other and excellent migration resistance is achieved, the insulating circuit substrate, the method for producing the copper/ceramic bonded body, and the method for producing an insulating circuit substrate.

DESCRIPTION OF EMBODIMENTS

Figure 1:
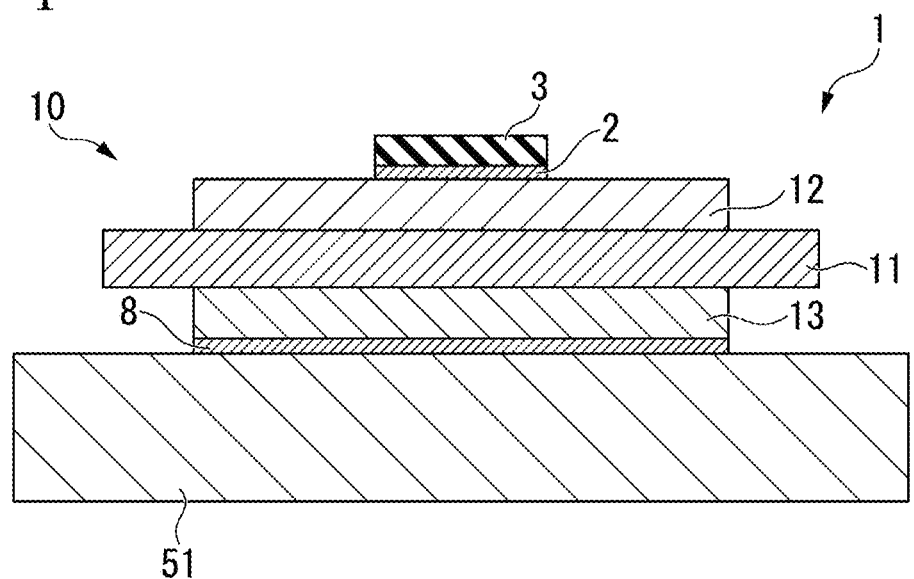
FIG. 1 is a schematic explanatory view of a power module using an insulating circuit substrate according to a first embodiment of the present invention.

Hereinafter, embodiments of the present invention will be described with reference to the accompanying drawings.

First Embodiment

A first embodiment of the present invention will be described with reference to FIGS. 1 to 4.

A copper/ceramic bonded body according to the present embodiment is an insulating circuit substrate 10 configured by bonding a ceramic substrate 11 which is a ceramic member to a copper plate 22 (circuit layer 12) and a copper plate 23 (metal layer 13), which are copper members.

FIG. 1 illustrates the insulating circuit substrate 10 according to the first embodiment of the present invention and a power module 1 using the insulating circuit substrate 10.

The power module 1 includes the insulating circuit substrate 10, a semiconductor element 3 bonded to one side (upper side in FIG. 1) of the insulating circuit substrate 10 with a first solder layer 2 interposed therebetween, and a heat sink 51 bonded to the other side (lower side in FIG. 1) of the insulating circuit substrate 10 with a second solder layer 8 interposed therebetween.

The insulating circuit substrate 10 includes the ceramic substrate 11, the circuit layer 12 disposed on one surface (upper surface in FIG. 1) of the ceramic substrate 11, and the metal layer 13 disposed on the other surface (lower surface in FIG. 1) of the ceramic substrate 11.

The ceramic substrate 11 prevents the electrical connection between the circuit layer 12 and the metal layer 13, and is made of highly insulating aluminum nitride in the present embodiment. The thickness of the ceramic substrate 11 is set to be in a range of 0.2 to 1.5 mm, and is set to 0.635 mm in the present embodiment.

Figure 4:
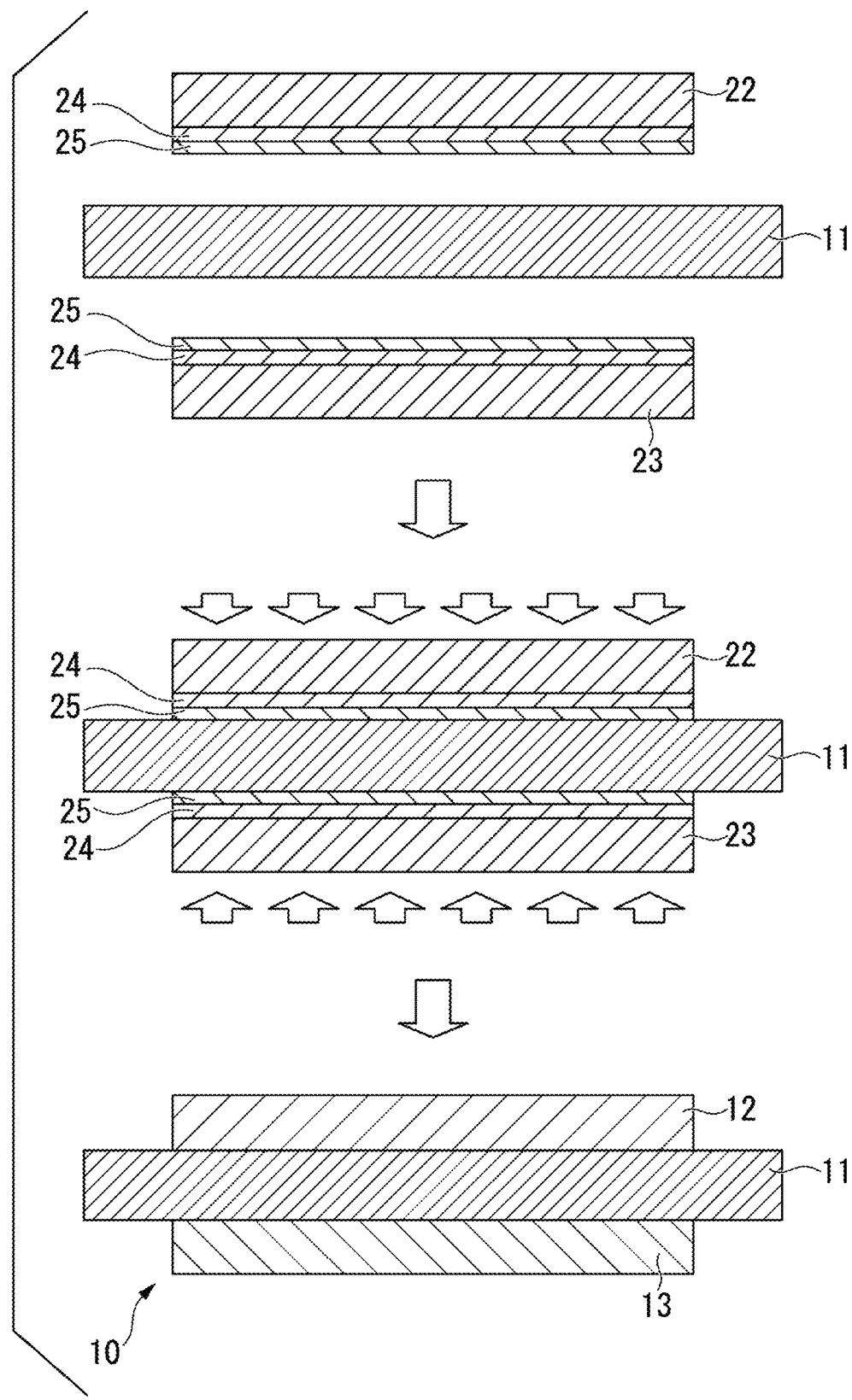
FIG. 4 is an explanatory view showing the method for producing the insulating circuit substrate according to the first embodiment of the present invention.

As shown in FIG. 4, the circuit layer 12 is formed by bonding the copper plate 22 made of copper or a copper alloy to one surface of the ceramic substrate 11. In the present embodiment, a rolled plate of oxygen-free copper is used as the copper plate 22 constituting the circuit layer 12. A circuit pattern is formed on the circuit layer 12, and one surface thereof (upper surface in FIG. 1) is a mounting surface on which the semiconductor element 3 is mounted. The thickness of the circuit layer 12 is set to be in a range of 0.1 mm or more and 2.0 mm or less, and is set to 0.6 mm in the present embodiment.

As shown in FIG. 4, the metal layer 13 is formed by bonding the copper plate 23 made of copper or a copper alloy to the other surface of the ceramic substrate 11. In the present embodiment, a rolled plate of oxygen-free copper is used as the copper plate 23 constituting the metal layer 13. The thickness of the metal layer 13 is set to be in a range of 0.1 mm or more and 2.0 mm or less, and is set to 0.6 mm in the present embodiment.

The heat sink 51 is for cooling the above-mentioned insulating circuit substrate 10, and in the present embodiment, is constituted by a heat dissipating plate made of a material having good thermal conductivity. In the present embodiment, the heat sink 51 is made of copper or a copper alloy excellent in thermal conductivity. The heat sink 51 and the metal layer 13 of the insulating circuit substrate 10 are bonded to each other with the second solder layer 8 interposed therebetween.

The ceramic substrate 11 and the circuit layer 12 (copper plate 22), and the ceramic substrate 11 and the metal layer 13 (copper plate 23) are bonded to each other with an active metal film 24 (in the present embodiment, a Ti film) made of one or more active metals selected from Ti, Zr, Nb, and Hf and a Mg film 25 interposed therebetween as shown in FIG. 4.

Figure 2:
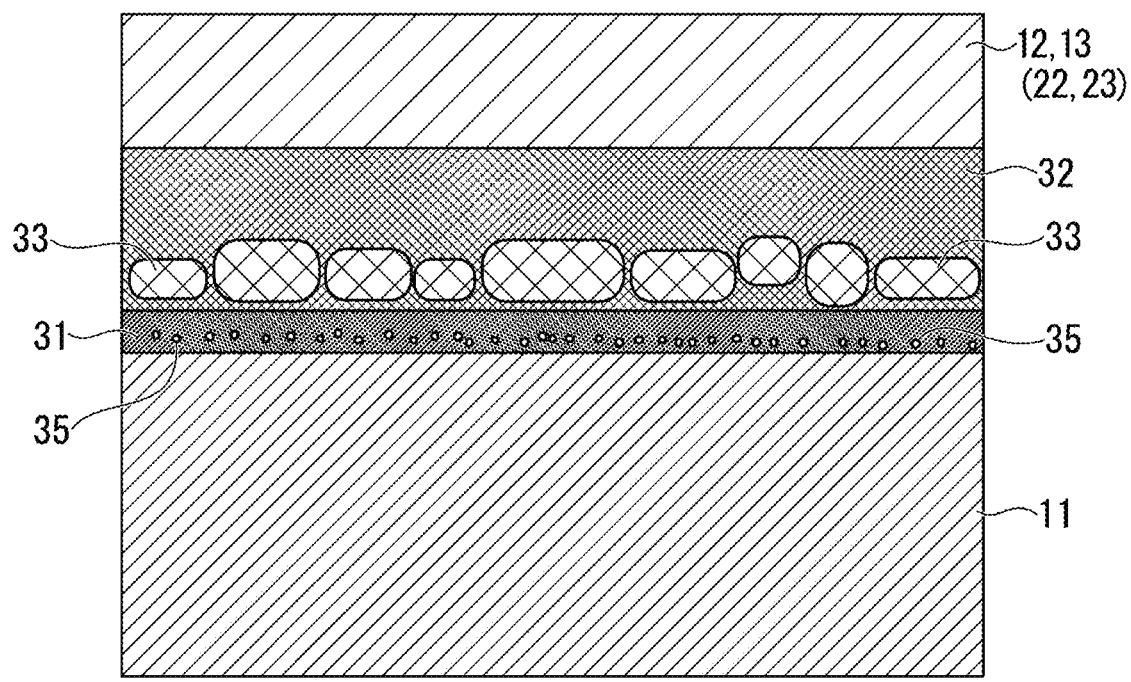
FIG. 2 is a schematic view of a bonding interface between a circuit layer (copper member) and a metal layer (copper member) and a ceramic substrate (ceramic member) of an insulating circuit substrate according to the first embodiment of the present invention.
Figure 3:
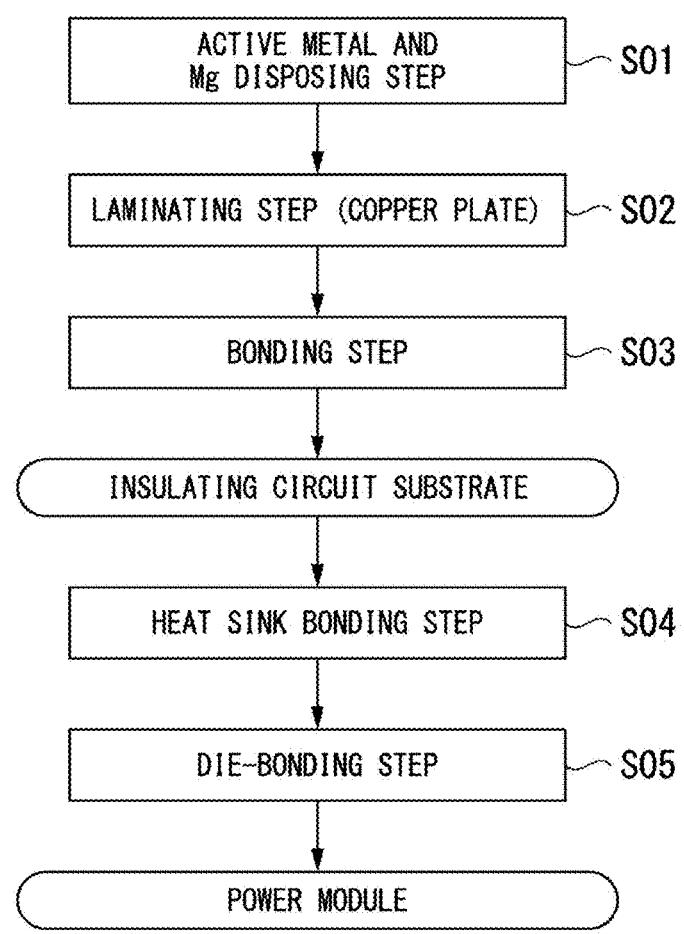
FIG. 3 is a flowchart showing a method for producing the insulating circuit substrate according to the first embodiment of the present invention.

At the bonding interface between the ceramic substrate 11 and the circuit layer 12 (copper plate 22) and the bonding interface between the ceramic substrate 11 and the metal layer 13 (copper plate 23), as shown in FIG. 2, a structure in which an active metal nitride layer 31 (titanium nitride layer in the present embodiment) formed on the ceramic substrate 11 side and a Mg solid solution layer 32 in which Mg is dissolved in a Cu matrix phase are laminated is provided.

The Mg solid solution layer 32 contains the above-mentioned active metal. In the present embodiment, an intermetallic compound phase 33 containing Cu and the active metal (Ti) is dispersed in the Mg solid solution layer 32. In the present embodiment, Ti is used as the active metal, and examples of intermetallic compounds constituting the intermetallic compound phase 33 containing Cu and Ti include $Cu_4Ti$, $Cu_3Ti_2$, $Cu_4Ti_3$, $CuTi$, $CuTi_2$, and $CuTi_3$.

The amount of Mg in the Mg solid solution layer 32 is in a range of 0.01 at % or more and 0.5 at % or less. The thickness of the Mg solid solution layer 32 is in a range of 0.1 μm or more and 80 μm or less. The amount of Mg in the Mg solid solution layer 32 is preferably in a range of 0.01 at % or more and 0.3 at % or less, but is not limited thereto.

In the present embodiment, Cu particles 35 are dispersed in the active metal nitride layer 31 (titanium nitride layer).

The particle size of the Cu particles 35 dispersed in the active metal nitride layer 31 (titanium nitride layer) is in a range of 10 nm or more and 100 nm or less. Furthermore, in the active metal nitride layer 31 (titanium nitride layer), the Cu concentration in a vicinity of an interface region from the interface with the ceramic substrate 11 to 20% of the thickness of the active metal nitride layer 31 (titanium nitride layer) is in a range of 0.3 at % or more and 15 at % or less.

The thickness of the active metal nitride layer 31 (titanium nitride layer) is in a range of 0.03 μm or more and 1.2 μm or less. In the active metal nitride layer 31 (titanium nitride layer), the Cu concentration in the vicinity of the interface region from the interface with the ceramic substrate 11 to 20% of the thickness of the active metal nitride layer 31 (titanium nitride layer) is preferably in a range of 0.3 at % or more and 12 at % or less, but is not limited thereto.

In the present embodiment, the area ratio of a $Cu_2Mg$ phase in a region from the bonding surface of the ceramic substrate 11 to 50 μm toward the circuit layer 12 side between the ceramic substrate 11 and the circuit layer 12 is 15% or less. The area ratio of the $Cu_2Mg$ phase in the region from the bonding surface of the ceramic substrate 11 to 50 μm toward the circuit layer 12 is preferably 0.01% or more and 10% or less, but is not limited thereto.

In the present embodiment, the above-mentioned $Cu_2Mg$ phase is a region in which, when the element map of Mg is acquired with an electron beam microanalyzer, the Mg concentration in a region where the presence of Mg is confirmed is 30 at % or more and 40 at % or less.

A method for producing the insulating circuit substrate 10 according to the present embodiment described above will be described with reference to FIGS. 3 and 4.

As shown in FIG. 4, a simple substance of one or more active metals selected from Ti, Zr, Nb, and Hf (in the present embodiment, Ti simple substance) and Mg simple substance are disposed between the copper plate 22 which is to become the circuit layer 12 and the ceramic substrate 11, and between the copper plate 23 which is to become the metal layer 13 and the ceramic substrate 11 (active metal and Mg disposing step S01). In the present embodiment, the active metal film 24 (Ti film) and the Mg film 25 are formed by vapor deposition of the active metal (Ti) and Mg, and the Mg film 25 is laminated in a state of not being in contact with the copper plate 22.

In the active metal and Mg disposing step S01, the amount of the active metal is in a range of 0.4 μmol/$cm^2$ or more and 47.0 μmol/$cm^2$ or less (in the present embodiment, Ti is in a range of 0.02 mg/$cm^2$ or more and 2.25 mg/$cm^2$ or less), and the amount of Mg is in a range of 7.0 μmol/$cm^2$ or more and 143.2 μmol/$cm^2$ or less (in a range of 0.17 mg/$cm^2$ or more and 3.48 mg/$cm^2$ or less).

The lower limit of the amount of the active metal is preferably 2.8 μmol/$cm^2$ or more, and the upper limit of the amount of the active metal is preferably 18.8 μmol/$cm^2$ or less. The lower limit of the amount of Mg is preferably 8.8 μmol/$cm^2$ or more, and the upper limit of the amount of Mg is preferably 37.0 μmol/$cm^2$ or less.

Next, the copper plate 22, the ceramic substrate 11, and the copper plate 23 are laminated with the active metal film 24 (Ti film) and the Mg film 25 interposed therebetween (laminating step S02).

The copper plate 22, the ceramic substrate 11, and the copper plate 23 which are laminated are pressed in the laminating direction and are loaded into a vacuum furnace and heated such that the copper plate 22, the ceramic substrate 11, and the copper plate 23 are bonded (bonding step S03).

The pressing load in the bonding step S03 is in a range of 0.049 MPa or more and 3.4 MPa or less. The pressing load in the bonding step S03 is preferably in a range of 0.294 MPa or more and 1.47 MPa or less, but is not limited thereto.

The heating temperature in the bonding step S03 is in a range of 670° C. or higher and 850° C. or lower, which is equal to or higher than the melting point of Mg, because Cu and Mg are laminated in a non-contact state. The lower limit of the heating temperature is preferably 700° C. or higher.

The degree of vacuum in the bonding step S03 is preferably in a range of $1\times10^{-6}$ Pa or more and $1\times10^{-2}$ Pa or less.

The retention time at the heating temperature is preferably in a range of 5 minutes or longer and 360 minutes or shorter. In order to lower the area ratio of the above-described $Cu_2Mg$ phase, the lower limit of the retention time at the heating temperature is preferably 60 minutes or longer. The upper limit of the retention time at the heating temperature is preferably 240 minutes or shorter.

As described above, the insulating circuit substrate 10 according to the present embodiment is produced by the active metal and Mg disposing process S01, the laminating step S02, and the bonding step S03.

The heat sink 51 is bonded to the other surface side of the metal layer 13 of the insulating circuit substrate 10 (heat sink bonding step S04).

The insulating circuit substrate 10 and the heat sink 51 are laminated with the solder material interposed therebetween and are loaded into a heating furnace such that the insulating circuit substrate 10 and the heat sink 51 are soldered to each other with the second solder layer 8 interposed therebetween.

Next, the semiconductor element 3 is bonded to one surface of the circuit layer 12 of the insulating circuit substrate 10 by soldering (die-bonding step S05). The power module 1 shown in FIG. 1 is produced by the above steps.

According to the insulating circuit substrate 10 (copper/ceramic bonded body) of the present embodiment configured as described above, the copper plate 22 (circuit layer 12) and the copper plate 23 (metal layer 13) made of oxygen-free copper and the ceramic substrate 11 made of aluminum nitride are bonded to each other with the active metal film 24 (Ti film) and the Mg film 25 interposed therebetween, and the active metal nitride layer 31 (titanium nitride layer) formed on the ceramic substrate 11 side and the Mg solid solution layer 32 in which Mg is dissolved in the Cu matrix phase are laminated at the bonding interfaces between the ceramic substrate 11 and the circuit layer 12 (copper plate 22) and between the ceramic substrate 11 and the metal layer 13 (copper plate 23).

The active metal nitride layer 31 (titanium nitride layer) is formed by the reaction between the active metal (Ti) disposed between the ceramic substrate 11 and the copper plates 22 and 23 and nitrogen of the ceramic substrate 11. Therefore, in the present embodiment, the ceramic substrate 11 sufficiently reacts at the bonding interfaces. In addition, the Mg solid solution layer 32 in which Mg is dissolved in the Cu matrix phase is formed so as to be laminated on the active metal nitride layer 31 (titanium nitride layer), and the above-mentioned active metal is contained in the Mg solid solution layer 32. In the present embodiment, since the intermetallic compound phase 33 containing Cu and the active metal (Ti) is dispersed in the Mg solid solution layer 32, Mg disposed between the ceramic substrate 11 and the copper plates 22 and 23 is sufficiently diffused on the copper plates 22 and 23 side. Therefore, in the present embodiment, Cu and the active metal (Ti) are sufficiently reacted to each other.

Therefore, an interfacial reaction proceeds sufficiently at the bonding interfaces between the ceramic substrate 11 and the copper plates 22 and 23, so that the insulating circuit substrate 10 (copper/ceramic bonded body) in which the circuit layer 12 (copper plate 22) and the ceramic substrate 11, and the metal layer 13 (copper plate 23) and the ceramic substrate 11 are reliably bonded can be obtained. In addition, since Ag is not present at the bonding interface, the insulating circuit substrate 10 (copper/ceramic bonded body) excellent in migration resistance can be obtained.

In particular, in the present embodiment, since the Cu particles 35 are dispersed in the active metal nitride layer 31 (titanium nitride layer), Cu of the copper plates 22 and 23 sufficiently reacts at the bonding surface of the ceramic substrate 11. Therefore, it becomes possible to obtain the insulating circuit substrate 10 (copper/ceramic bonded body) in which the copper plates 22 and 23 and the ceramic substrate 11 are firmly bonded.

In the present embodiment, since the area ratio of the $Cu_2Mg$ phase in the region from the bonding surface of the ceramic substrate 11 to 50 μm toward the circuit layer 12 (copper plate 22) side between the ceramic substrate 11 and the circuit layer 12 (copper plate 22) is limited to 15% or less, for example, even in a case where ultrasonic bonding or the like is performed, it is possible to limit the occurrence of cracking and the like at the bonding interface.

According to the method for producing the insulating circuit substrate 10 (copper/ceramic bonded body) of the present embodiment, since the active metal and Mg disposing step S01 of disposing the simple substance of the active metal (Ti) (the active metal film 24) and the Mg simple substance (the Mg film 25) between the copper plates 22 and 23 and the ceramic substrate 11, the laminating step S02 of laminating the copper plates 22 and 23 and the ceramic substrate 11 with the active metal film 24 and the Mg film 25 interposed therebetween, and the bonding step S03 of performing the heating treatment on the copper plate 22, the ceramic substrate 11, and the copper plate 23 which are laminated in a state of being pressed in the laminating direction in a vacuum atmosphere so as to be bonded together are provided, no gas or residue of organic matter remains at the bonding interface. In addition, since the simple substance of the active metal (Ti) and the Mg simple substance are disposed, the composition does not vary and a uniform liquid phase is generated.

In the active metal and Mg disposing step S01, since the amount of the active metal is in a range of 0.4 μmol/cm² or more and 47.0 μmol/cm² or less (in the present embodiment, Ti is in a range of 0.02 mg/cm² or more and 2.25 mg/cm² or less), and the amount of Mg is in a range of 7.0 μmol/cm² or more and 143.2 μmol/cm² or less (in a range of 0.17 mg/cm² or more and 3.48 mg/cm² or less), a liquid phase necessary for the interfacial reaction can be sufficiently obtained, and an excessive reaction of the ceramic substrate 11 can be limited.

Therefore, the insulating circuit substrate 10 (copper/ceramic bonded body) in which the copper plates 22 and 23 and the ceramic substrate 11 are reliably bonded can be obtained. In addition, since Ag is not used for bonding, the insulating circuit substrate 10 excellent in migration resistance can be obtained.

In a case where the amount of the active metal is less than 0.4 μmol/cm² (the amount of Ti is less than 0.02 mg/cm²) and the amount of Mg is less than 7.0 μmol/cm² (less than 0.17 mg/cm²), the interfacial reaction becomes insufficient, and there is concern that the bonding ratio may decrease. In addition, in a case where the amount of the active metal exceeds 47.0 μmol/cm² (the amount of Ti exceeds 2.25 mg/cm²), the intermetallic compound phase 33 which has a large amount of the active metal and is relatively hard is excessively generated, and the Mg solid solution layer 32 becomes too hard, so that there is concern that cracking may occur in the ceramic substrate 11. In addition, in a case where the amount of Mg is more than 143.2 μmol/cm² (more than 3.48 mg/cm²), the decomposition reaction of the ceramic substrate 11 excessively occurs and Al is excessively formed, so that intermetallic compounds of these and Cu, the active metal (Ti), and Mg are formed in large amounts. Accordingly, there is concern that cracking may occur in the ceramic substrate 11.

From the above description, in the present embodiment, the amount of the active metal is in a range of 0.4 μmol/cm² or more and 47.0 μmol/cm² or less (Ti is in a range of 0.02 mg/cm² or more and 2.25 mg/cm² or less), and the amount of Mg is in a range of 7.0 μmol/cm² or more and 143.2 μmol/cm² or less (in a range of 0.17 mg/cm² or more and 3.48 mg/cm² or less).

In the present embodiment, since the pressing load in the bonding step S03 is 0.049 MPa or more, the ceramic substrate 11, the copper plates 22 and 23, the active metal film 24 (Ti film), and the Mg film 25 can be brought into close contact, so that the interfacial reactions therebetween during heating can be promoted. In addition, since the pressing load in the bonding step S03 is 3.4 MPa or less, cracking and the like in the ceramic substrate 11 can be limited.

In the present embodiment, since Cu and Mg are laminated in a non-contact state and the heating temperature in the bonding step S03 is 670° C. or higher, which is equal to or higher than the melting point of Mg, a liquid phase can be sufficiently generated at the bonding interfaces. On the other hand, since the heating temperature in the bonding step S03 is 850° C. or less, the occurrence of the eutectic reaction between Cu and the active metal (Ti) can be limited, and the excessive generation of the liquid phase can be limited. Furthermore, the thermal load on the ceramic substrate 11 is reduced, so that the deterioration of the ceramic substrate 11 can be limited.

Second Embodiment

A second embodiment of the present invention will be described with reference to FIGS. 5 to 8.

A copper/ceramic bonded body according to the present embodiment is an insulating circuit substrate 110 configured by bonding a ceramic substrate 111 which is a ceramic member to a copper plate 122 (circuit layer 112) which is a copper member.

Figure 5:
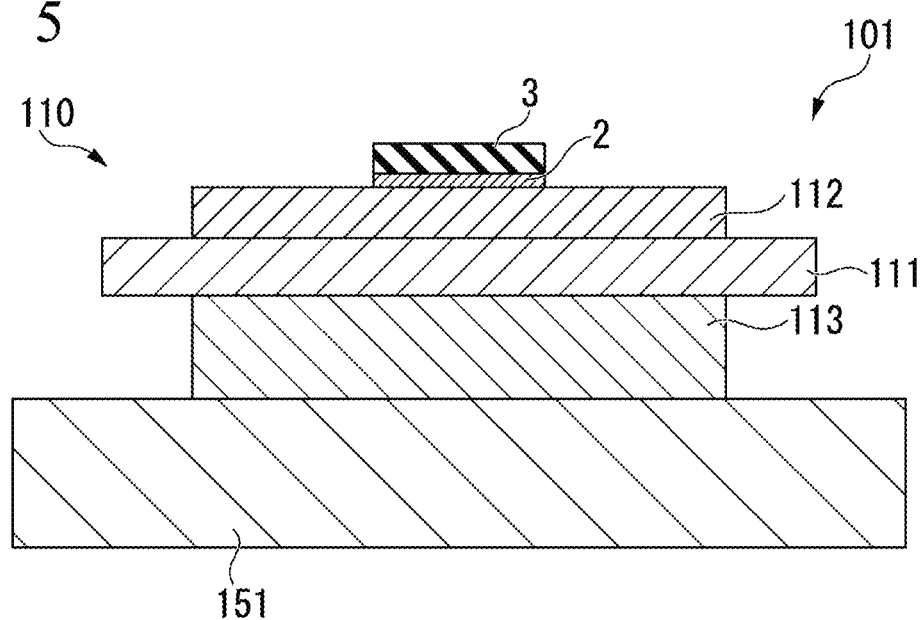
FIG. 5 is a schematic explanatory view of a power module using an insulating circuit substrate according to a second embodiment of the present invention.

FIG. 5 illustrates the insulating circuit substrate 110 according to the second embodiment of the present invention and a power module 101 using the insulating circuit substrate 110.

The power module 101 includes the insulating circuit substrate 110, the semiconductor element 3 bonded to a surface on one side (upper side in FIG. 5) of the insulating circuit substrate 110 with the solder layer 2 interposed therebetween, and a heat sink 151 disposed on the other side (lower side in FIG. 5) of the insulating circuit substrate 110.

The solder layer 2 is, for example, a Sn—Ag-based, Sn—In-based, or Sn—Ag—Cu-based solder material.

The insulating circuit substrate 110 includes the ceramic substrate 111, the circuit layer 112 disposed on one surface (upper surface in FIG. 5) of the ceramic substrate 111, and a metal layer 113 disposed on the other surface (lower surface in FIG. 5) of the ceramic substrate 111.

The ceramic substrate 111 prevents the electrical connection between the circuit layer 112 and the metal layer 113, and is made of highly insulating silicon nitride in the present embodiment. The thickness of the ceramic substrate 111 is set to be in a range of 0.2 to 1.5 mm, and is set to 0.32 mm in the present embodiment.

Figure 8:
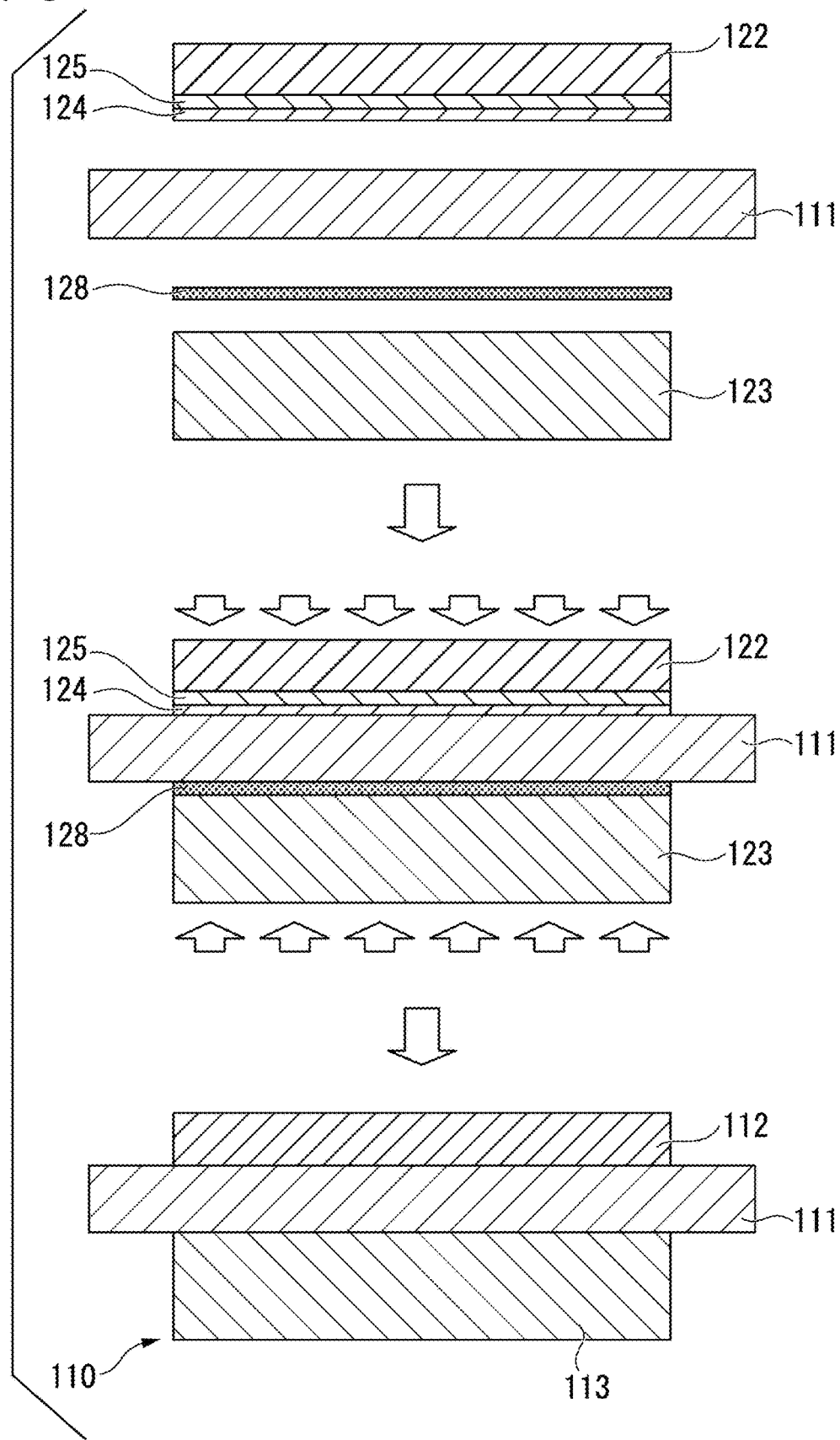
FIG. 8 is an explanatory view showing the method for producing the insulating circuit substrate according to the second embodiment of the present invention.

As shown in FIG. 8, the circuit layer 112 is formed by bonding the copper plate 122 made of copper or a copper alloy to one surface of the ceramic substrate 111. In the present embodiment, a rolled plate of oxygen-free copper is used as the copper plate 122 constituting the circuit layer 112. A circuit pattern is formed on the circuit layer 112, and one surface thereof (upper surface in FIG. 5) is a mounting surface on which the semiconductor element 3 is mounted. The thickness of the circuit layer 112 is set to be in a range of 0.1 mm or more and 2.0 mm or less, and is set to 0.6 mm in the present embodiment.

As shown in FIG. 8, the metal layer 113 is formed by bonding an aluminum plate 123 to the other surface of the ceramic substrate 111. In the present embodiment, the metal layer 113 is formed by bonding the aluminum plate 123 made of a rolled plate of aluminum (so-called 4N aluminum) having a purity of 99.99 mass % or more to the ceramic substrate 111. The aluminum plate 123 has a 0.2% proof stress of 30 N/mm$^2$ or less. The thickness of the metal layer 113 (aluminum plate 123) is set to be in a range of 0.5 mm or more and 6 mm or less, and is set to 2.0 mm in the present embodiment. As shown in FIG. 8, the metal layer 113 is formed by bonding the aluminum plate 123 to the ceramic substrate 111 using an Al—Si-based brazing material 128.

The heat sink 151 is for cooling the above-mentioned insulating circuit substrate 110, and in the present embodiment, is constituted by a heat radiation plate made of a material having good thermal conductivity. In the present embodiment, the heat sink 151 is made of A6063 (aluminum alloy). In the present embodiment, the heat sink 151 is bonded to the metal layer 113 of the insulating circuit substrate 110 using, for example, an Al—Si—based brazing material.

The ceramic substrate 111 and the circuit layer 112 (copper plate 122) are bonded to each other with an active metal film 124 (in the present embodiment, a Ti film) made of one or more active metals selected from Ti, Zr, Nb, and Hf and a Mg film 125 interposed therebetween as shown in FIG. 8.

Figure 6:
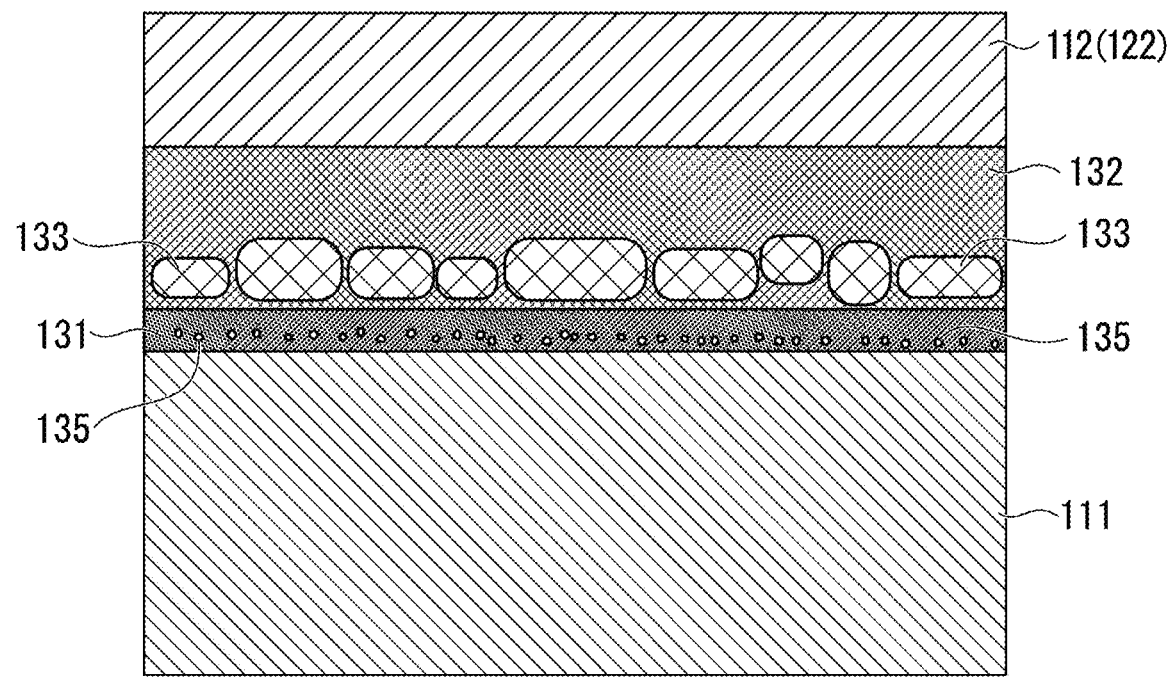
FIG. 6 is a schematic view of a bonding interface between a circuit layer (copper member) and a ceramic substrate (ceramic member) of an insulating circuit substrate according to the second embodiment of the present invention.
Figure 7:
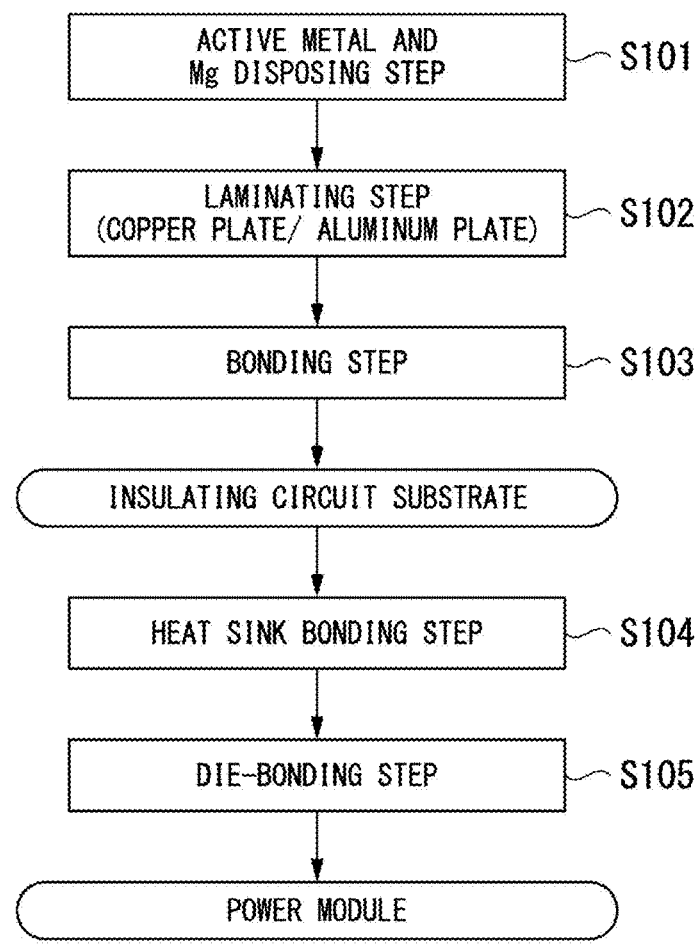
FIG. 7 is a flowchart showing a method for producing the insulating circuit substrate according to the second embodiment of the present invention.

At the bonding interface between the ceramic substrate 111 and the circuit layer 112 (copper plate 122), as shown in FIG. 6, an active metal nitride layer 131 (titanium nitride layer in the present embodiment) formed on the ceramic substrate 111 side and a Mg solid solution layer 132 in which Mg is dissolved in a Cu matrix phase are laminated.

The Mg solid solution layer 132 contains the above-mentioned active metal. In the present embodiment, an intermetallic compound phase 133 containing Cu and the active metal (Ti) is dispersed in the Mg solid solution layer 132. In the present embodiment, Ti is used as the active metal, and examples of intermetallic compounds constituting the intermetallic compound phase 133 containing Cu and Ti include $Cu_4Ti$, $Cu_3Ti_2$, $Cu_4Ti_3$, $CuTi$, $CuTi_2$, and $CuTi_3$.

The amount of Mg in the Mg solid solution layer 132 is in a range of 0.01 at % or more and 0.5 at % or less. The thickness of the Mg solid solution layer 132 is in a range of 0.1 μm or more and 80 μm or less.

In the present embodiment, Cu particles 135 are dispersed in the active metal nitride layer 131 (titanium nitride layer).

The particle size of the Cu particles 135 dispersed in the active metal nitride layer 131 (titanium nitride layer) is in a range of 10 nm or more and 100 nm or less. The Cu concentration in a vicinity of an interface region from the interface with the ceramic substrate 111 in the active metal nitride layer 131 (titanium nitride layer) to 20% of the thickness of the active metal nitride layer 131 (titanium nitride layer) is in a range of 0.3 at % or more and 15 at % or less.

The thickness of the active metal nitride layer 131 (titanium nitride layer) is in a range of 0.03 μm or more and 1.2 μm or less.

In the present embodiment, the area ratio of a $Cu_2Mg$ phase in a region from the bonding surface of the ceramic substrate 111 to 50 μm toward the circuit layer 112 side between the ceramic substrate 111 and the circuit layer 112 is 15% or less.

A method for producing the insulating circuit substrate 110 according to the present embodiment described above will be described with reference to FIGS. 7 and 8.

As shown in FIG. 8, a simple substance of one or more active metals selected from Ti, Zr, Nb, and Hf (in the present embodiment, Ti simple substance) and Mg simple substance are disposed between the copper plate 122 which is to become the circuit layer 112 and the ceramic substrate 111 (active metal and Mg disposing step S101). In the present embodiment, the active metal film 124 (Ti film) and the Mg film 125 are formed by vapor deposition of the active metal (Ti) and Mg, and the Mg film 125 is formed to be in contact with the copper plate 122.

In the active metal and Mg disposing step S101, the amount of the active metal is in a range of 0.4 μmol/cm$^2$ or more and 47.0 μmol/cm$^2$ or less (in the present embodiment, Ti is in a range of 0.02 mg/cm$^2$ or more and 2.25 mg/cm$^2$ or less), and the amount of Mg is in a range of 7.0 μmol/cm$^2$ or more and 143.2 μmol/cm$^2$ or less (in a range of 0.17 mg/cm$^2$ or more and 3.48 mg/cm$^2$ or less).

In a case where the amount of the active metal is less than 0.4 μmol/cm$^2$ (the amount of Ti is less than 0.02 mg/cm$^2$) and the amount of Mg is less than 7.0 μmol/cm$^2$ (less than 0.17 mg/cm$^2$), the interfacial reaction becomes insufficient, and there is concern that the bonding ratio may decrease. In addition, in a case where the amount of the active metal exceeds 47.0 μmol/cm$^2$ (the amount of Ti exceeds 2.25 mg/cm$^2$), the intermetallic compound phase 133 which has a large amount of the active metal and is relatively hard is excessively generated, and the Mg solid solution layer 132 becomes too hard, so that there is concern that cracking may occur in the ceramic substrate 111. In addition, in a case where the amount of Mg is more than 143.2 μmol/cm$^2$ (more than 3.48 mg/cm$^2$), the decomposition reaction of the ceramic substrate 111 becomes excessive and Al is excessively generated, so that intermetallic compounds of these and Cu, the active metal (Ti), and Mg are generated in large amounts. Accordingly, there is concern that cracking may occur in the ceramic substrate 111.

The lower limit of the amount of the active metal is preferably 2.8 µmol/cm² or more, and the upper limit of the amount of the active metal is preferably 18.8 µmol/cm² or less. The lower limit of the amount of Mg is preferably 8.8 µmol/cm² or more, and the upper limit of the amount of Mg is preferably 37.0 µmol/cm² or less.

Next, the copper plate 122 and the ceramic substrate 111 are laminated with the active metal film 124 (Ti film) and the Mg film 125 interposed therebetween (laminating step S102).

In the present embodiment, as shown in FIG. 8, the aluminum plate 123 which is to become the metal layer 113 is laminated on the other surface side of the ceramic substrate 111 with the Al—Si-based brazing material 128 interposed therebetween.

The copper plate 122, the ceramic substrate 111, and the aluminum plate 123 which are laminated are pressed in the laminating direction and are loaded into a vacuum furnace and heated such that the copper plate 122, the ceramic substrate 111, and the aluminum plate 123 are bonded (bonding step S103).

The pressing load in the bonding step S103 is in a range of 0.049 MPa or more and 3.4 MPa or less. The pressing load in the bonding step S103 is preferably in a range of 0.294 MPa or more and 1.47 MPa or less, but is not limited thereto.

The heating temperature in the bonding step S103 is equal to or higher than 500° C., which is equal to or higher than the eutectic temperature of Mg and Cu, and equal to or lower than 850° C., which is equal to or lower than the eutectic temperature of Cu and the active metal (Ti), because Cu and Mg are laminated in a contact state. The lower limit of the heating temperature is preferably 700° C. or higher.

In the present embodiment, since the aluminum plate 123 is bonded using the Al—Si-based brazing material 128, the heating temperature is in a range of 600° C. or higher and 650° C. or lower.

The degree of vacuum in the bonding step S103 is preferably in a range of $1 \times 10^{-6}$ Pa or more and $1 \times 10^{-2}$ Pa or less.

The retention time at the heating temperature is preferably in a range of 5 minutes or longer and 360 minutes or shorter. In order to lower the area ratio of the above-described $Cu_2Mg$ phase, the lower limit of the retention time at the heating temperature is preferably 60 minutes or longer. The upper limit of the retention time at the heating temperature is preferably 240 minutes or shorter.

As described above, the insulating circuit substrate 110 according to the present embodiment is produced by the active metal and Mg disposing step S101, the laminating step S102, and the bonding step S103.

The heat sink 151 is bonded to the other surface side of the metal layer 113 of the insulating circuit substrate 110 (heat sink bonding step S104).

The insulating circuit substrate 110 and the heat sink 151 are laminated with the brazing material interposed therebetween, pressed in the laminating direction, and loaded into a vacuum furnace for brazing. Accordingly, the metal layer 113 of the insulating circuit substrate 110 and the heat sink 151 are bonded to each other. At this time, as the brazing material, for example, an Al—Si-based brazing material foil having a thickness of 20 to 110 µm can be used, and the brazing temperature is preferably set to a temperature lower than the heating temperature in the bonding step S103.

Next, the semiconductor element 3 is bonded to one surface of the circuit layer 112 of the insulating circuit substrate 110 by soldering (die-bonding step S105).

The power module 101 shown in FIG. 5 is produced by the above steps.

According to the insulating circuit substrate 110 (copper/ceramic bonded body) of the present embodiment configured as described above, the copper plate 122 (circuit layer 112) and the ceramic substrate 111 made of silicon nitride are bonded to each other with the active metal film 124 (Ti film) and the Mg film 125 interposed therebetween, the active metal nitride layer 131 (titanium nitride layer) formed on the ceramic substrate 111 side and the Mg solid solution layer 132 in which Mg is dissolved in the Cu matrix phase are laminated at the bonding interface between the ceramic substrate 111 and the circuit layer 112 (copper plate 122), and the active metal is present in the Mg solid solution layer 132. In the present embodiment, since the intermetallic compound phase 133 containing Cu and the active metal (Ti) is dispersed, as in the first embodiment, the insulating circuit substrate 110 (copper/ceramic bonded body) in which the circuit layer 112 (copper plate 122) and the ceramic substrate 111 are reliably bonded to each other can be obtained. In addition, since Ag is not present at the bonding interface, the insulating circuit substrate 110 (copper/ceramic bonded body) excellent in migration resistance can be obtained.

In the present embodiment, since the Cu particles 135 are dispersed in the active metal nitride layer 131 (titanium nitride layer), Cu of the copper plate 122 sufficiently reacts at the bonding surface of the ceramic substrate 111. Therefore, it becomes possible to obtain the insulating circuit substrate 110 (copper/ceramic bonded body) in which the circuit layer 112 (copper plate 122) and the ceramic substrate 111 are firmly bonded.

In the present embodiment, since the area ratio of the $Cu_2Mg$ phase in the region from the bonding surface of the ceramic substrate 111 to 50 mn toward the circuit layer 112 (copper plate 122) side between the ceramic substrate 111 and the circuit layer 112 (copper plate 122) is limited to 15% or less, for example, even in a case where ultrasonic bonding or the like is performed, it is possible to limit the occurrence of cracking and the like at the bonding interface.

According to the method for producing the insulating circuit substrate 110 (copper/ceramic bonded body) of the present embodiment, as in the first embodiment, a liquid phase is appropriately generated at the bonding interface between the circuit layer 112 (copper plate 122) and the ceramic substrate 111 to enable a sufficient interfacial reaction, and the insulating circuit substrate 110 (copper/ceramic bonded body) in which the copper plate 122 and the ceramic substrate 111 are reliably bonded to each other can be obtained. Moreover, since Ag is not used for bonding, the insulating circuit substrate 110 excellent in migration resistance can be obtained.

In the present embodiment, since Cu and Mg are laminated in a contact state and the heating temperature in the bonding step S103 is equal to or higher than 500° C., which is equal to or higher than the eutectic temperature of Cu and Mg, a liquid phase can be sufficiently generated at the bonding interface.

In the present embodiment, in the laminating step S102, since the aluminum plate 123 is laminated on the other surface side of the ceramic substrate 111 with the Al—Si-based brazing material 128 interposed therebetween and the copper plate 122 and the ceramic substrate 111, and the ceramic substrate 111 and the aluminum plate 123 are simultaneously bonded, the insulating circuit substrate 110 provided with the circuit layer 112 made of copper and the metal layer 113 made of aluminum can be efficiently produced. In addition, the occurrence of warping in the insulating circuit substrate 110 can be limited.

While the embodiments of the present invention have been described above, the present invention is not limited thereto and can be modified as appropriate without departing from the technical spirit of the invention.

For example, although the copper plate constituting the circuit layer or the metal layer is described as the rolled plate of oxygen-free copper, the copper plate is not limited thereto, and may also be made of another kind of copper or copper alloy.

In the second embodiment, although the aluminum plate constituting the metal layer is described as the rolled plate of pure aluminum having a purity of 99.99 mass %, the aluminum plate is not limited thereto, and may also be made of another kind of aluminum or aluminum alloy such as aluminum having a purity of 99 mass % (2N aluminum).

Although the heat sink is exemplified by the heat radiation plate, the heat sink is not limited thereto, and there is no particular limitation on the structure of the heat sink For example, one having a flow path through which a refrigerant flows or one having a cooling fin may be used. As the heat sink, a composite material (for example, AlSiC) containing aluminum or an aluminum alloy can also be used.

A buffer layer made of aluminum or an aluminum alloy or a composite material containing aluminum (for example, AlSiC) may be provided between the top plate portion or heat dissipating plate of the heat sink and the metal layer.

In the present embodiment, although the formation of the active metal film (Ti film) and the Mg film is described in the active metal and Mg disposing step, the active metal and Mg disposing step is not limited thereto, and the active metal and Mg may be codeposited. Also in this case, the active metal film and the Mg film which are formed are not alloyed, and the simple substance of the active metal and Mg simple substance are disposed. In a case where the active metal and the Mg film are formed by codeposition, Mg and Cu are in a contact state, so that the lower limit of the heating temperature in the bonding step can be set to 500° C. or higher.

Although use of Ti as the active metal has been described in the present embodiment, the active metal is not limited thereto, and one or more selected from Ti, Zr, Nb, and Hf may be used as the active metal.

In a case where Zr is used as the active metal, Zr is present as an intermetallic compound phase with Cu in the Mg solid solution layer. Examples of intermetallic compounds constituting the intermetallic compound phase include $Cu_5Zr$, $Cu_{51}Zr_{14}$, $Cu_8Zr_3$, $Cu_{10}Zr_7$, $CuZr$, $Cu_5Zr_8$, and $CuZr_2$.

In a case where Hf is used as the active metal, Hf is present as an intermetallic compound phase with Cu in the Mg solid solution layer. Examples of intermetallic compounds constituting the intermetallic compound phase include $Cu_{51}Hf_{14}$, $Cu_8Hf_3$, $Cu_{10}Hf_7$, and $CuHf_2$.

In a case where Ti and Zr are used as the active metal, Ti and Zr are present as intermetallic compound phases containing Cu and the active metals in the Mg solid solution layer. Examples of intermetallic compounds constituting the intermetallic compound phases include $Cu_{1.5}Zr_{0.75}Ti_{0.75}$.

In a case where Nb is used as the active metal, Nb is dissolved in the Mg solid solution layer.

In the active metal and Mg disposing step, the amount of the active metal at the bonding interface may be in a range of 0.4 μmol/cm² or more and 47.0 μmol/cm² or less, the amount of Mg may be in a range of 7.0 μmol/cm² or more and 143.2 μmol/cm² or less, and the active metal film and the Mg film may be laminated in multiple layers like Mg film/active metal film/Mg film. Alternatively, a Cu film may be formed between the active metal film and the Mg film.

The simple substance of the active metal and the Mg simple substance may be provided by disposing a foil material or may be formed into a film by sputtering.

In the present embodiment, configuring the power module by mounting the power semiconductor element on the circuit layer of the insulating circuit substrate has been described, but the present embodiment is not limited thereto. For example, an LED module may be configured by mounting an LED element on the insulating circuit substrate, or a thermoelectric module may be configured by mounting a thermoelectric element on the circuit layer of the insulating circuit substrate.

EXAMPLES

Confirmation experiments conducted to confirm the effectiveness of the present invention will be described.

Example 1

Copper/ceramic bonded bodies having a structure shown in Table 1 were formed. Specifically, as shown in Table 1, a copper/ceramic bonded body was formed by laminating copper plates in which Ti simple substance as an active metal and Mg simple substance were formed into films on both surfaces of a 40 mm square ceramic substrate and bonding the laminated plates under bonding conditions shown in Table 1.

The thickness of the ceramic substrate used was 0.635 mm in a case of aluminum nitride and 0.32 mm in a case of silicon nitride. In addition, the degree of vacuum of the vacuum furnace at the time of bonding was $5\times10^{-3}$ Pa.

Regarding the copper/ceramic bonded bodies obtained as described above, the bonding interface was observed, and an active metal nitride layer (titanium nitride layer), a Mg solid solution layer, an intermetallic compound phase, and the presence or absence of Cu particles and the Cu concentration in the active metal nitride layer (titanium nitride layer) were checked. In addition, the initial bonding ratio of the copper/ceramic bonded body, cracking of the ceramic substrate after thermal cycles, and migration properties were evaluated as follows.

(Mg Solid Solution Layer)

Regarding the bonding interface between copper plate and the ceramic substrate, a region (400 μm×600 μm) including the bonding interface was observed under the conditions of a magnification of 2000 times and an accelerating voltage of 15 kV using an EPMA apparatus (JXA-8539F manufactured by JEOL Ltd.), quantitative analysis was performed on 10 points at intervals of 10 μm from the surface of the ceramic substrate (the surface of the active metal nitride layer) toward the copper plate side, and a region having a Mg concentration of 0.01 at % or more was regarded as a Mg solid solution layer.

(Presence or Absence of Active Metal in Mg Solid Solution Layer (Presence or Absence of intermetallic Compound Phase)

Regarding the bonding interface between copper plate and the ceramic substrate, the element map of an active metal (Ti) of the region (400 μm×600 μm) including the bonding interface was acquired under the conditions of a magnification of 2000 times and an accelerating voltage of 15 kV using an electron probe microanalyzer (JXA-8539F manufactured by JEOL Ltd.), and the presence or absence of the active metal (Ti) was checked. A region satisfying that the Cu concentration was 5 at % or more and the active metal concentration (Ti concentration) was 16 at % or more and 90 at % or less in a five-point average of quantitative analysis in the region where the presence of the active metal (Ti) was confirmed was regarded as an intermetallic compound phase.

(Active Metal Nitride Layer)

The bonding interface between the copper plate and the ceramic substrate was observed under the conditions of a magnification of 115,000 times and an accelerating voltage of 200 kV using a scanning transmission electron microscope (Titan ChemiSTEM (with EDS detector) manufactured by Thermo Fisher Scientific), mapping was performed using energy dispersive X-ray analysis (NSS7 manufactured by Thermo Fisher Scientific), an electron diffraction pattern was obtained by irradiating a region where the active metal (Ti) and N overlap with each other with an electron beam narrowed to about 1 nm (nano beam diffraction (NBD) method), and the presence or absence of an active metal nitride layer (titanium nitride layer) was checked.

The presence or absence of Cu particles in the region confirmed as the active metal nitride layer (titanium nitride layer) was checked, and the Cu concentration obtained from the 5-point average of the quantitative analysis in this region was regarded as the average concentration of Cu dispersed in the active metal nitride layer (titanium nitride layer).

(Initial Bonding Ratio)

The bonding ratio between the copper plate and the ceramic substrate was determined using the following equation using an ultrasonic flaw detector (FineSAT200 manufactured by Hitachi Power Solutions Co., Ltd.). The initial bonding area was the area to be bonded before bonding, that is, the area of the bonding surface of the copper plate. In the ultrasonic flaw detection image, peeling was indicated by a white portion in the bonded portion, and thus the area of the white portion was regarded as a peeling area.

(Bonding ratio)={(initial bonding area)−(peeling area)}/(initial bonding area)×100

(Cracking in Ceramic Substrate)

Using a thermal shock tester (TSA-72ES manufactured by ESPEC Corp.), 300 cycles, where one cycle is 10 minutes at −50° C. and 10 minutes at 150° C., was performed in a gas phase.

The presence or absence of cracking in the ceramic substrate after applying the above-mentioned thermal cycles was evaluated.

(Migration)

The electrical resistance between circuit patterns was measured after leaving for 500 hours under the conditions of a distance between the circuit patterns of a circuit layer of 0.8 mm, a temperature of 60° C., a humidity of 95% RH, and a voltage of DC50V. A case where the resistance value was $1\times10^6 \Omega$ or less was determined as a short circuit and referred to as "B". A case where the resistance value was not $1\times10^6 \Omega$ or less was determined as "A".

Figure 9A:
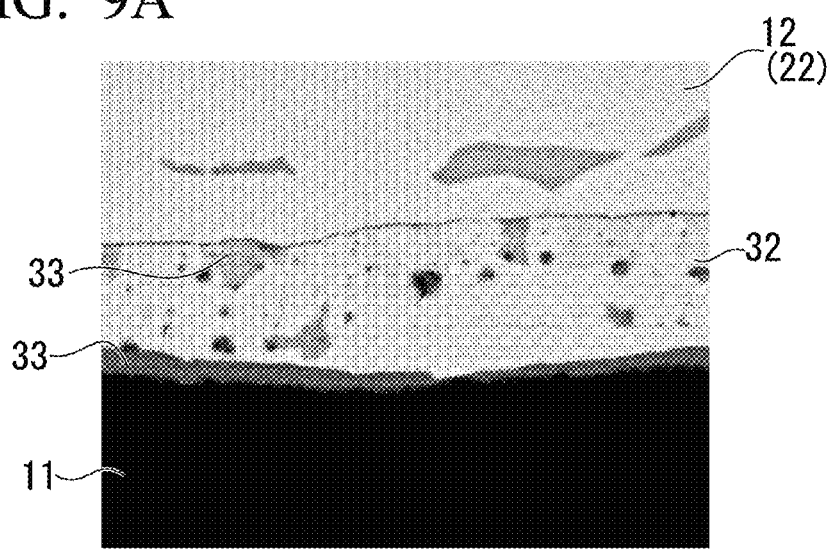
FIG. 9A is an observation result of a bonding interface between a copper plate and a ceramic substrate in a copper/ceramic bonded body of Example 5.
Figure 9B:
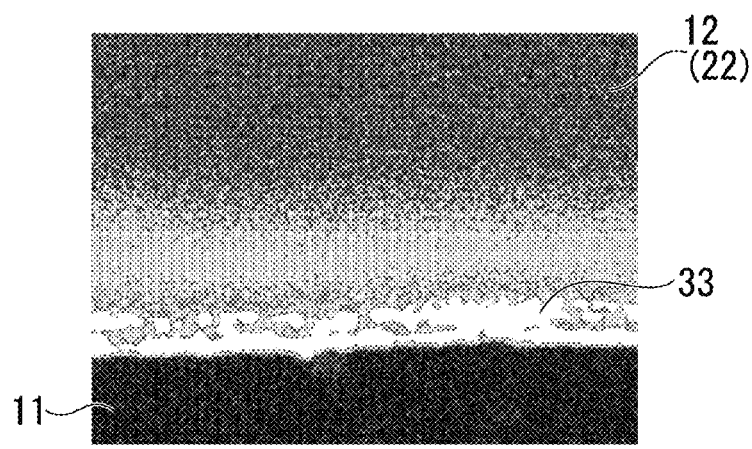
FIG. 9B is an observation result of the bonding interface between the copper plate and the ceramic substrate in the copper/ceramic bonded body of Example 5.
Figure 9C:
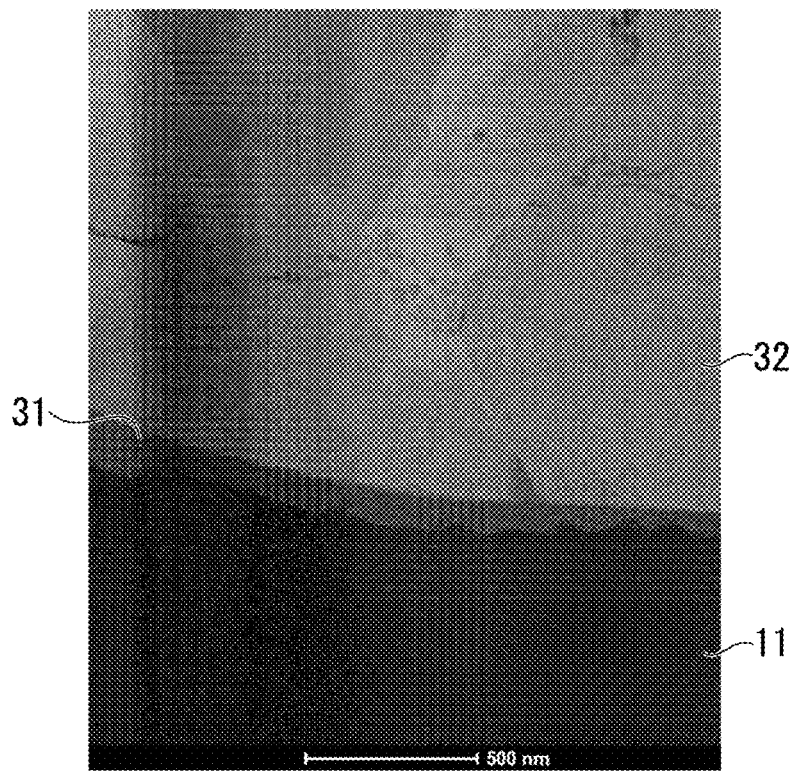
FIG. 9C is an observation result of the bonding interface between the copper plate and the ceramic substrate in the copper/ceramic bonded body of Example 5.

The evaluation results are shown in Table 2. The observation results of Example 5 are shown in FIGS. 9A, 9B, and 9C.

TABLE 1

| | | Active metal (Ti) and Mg disposing step | | | | | | |
|---|---|---|---|---|---|---|---|---|
| | | Amount of active metal (Ti) | | Amount of Mg | | Bonding conditions | | |
| | | | | | | Load | Temperature | Time |
| | Film configuration* | mg/cm² | μmol/cm² | mg/cm² | μmol/cm² | MPa | ° C. | min |
| Example 1 | Cu/Ti + Mg/AlN | 0.02 | 0.4 | 1.7 | 69.9 | 1.96 | 680 | 30 |
| Example 2 | Cu/Ti/Mg/AlN | 2.25 | 47.0 | 0.51 | 21.0 | 1.96 | 720 | 5 |
| Example 3 | Cu/Ti + Mg/AlN | 0.14 | 2.9 | 0.17 | 7.0 | 0.98 | 640 | 30 |
| Example 4 | Cu/Mg/Ti/Si₃N₄ | 0.14 | 2.9 | 3.48 | 143.2 | 0.98 | 800 | 5 |
| Example 5 | Cu/Ti + Mg/AlN | 0.14 | 2.9 | 0.51 | 21.0 | 0.049 | 700 | 30 |
| Example 6 | Cu/Ti + Mg/Si₃N₄ | 0.14 | 2.9 | 0.51 | 21.0 | 3.4 | 700 | 30 |
| Example 7 | Cu/Mg/Ti/Mg/AlN | 0.45 | 9.4 | 0.85 | 35.0 | 0.294 | 500 | 60 |
| Example 8 | Cu/Mg/Ti/Mg/AlN | 0.45 | 9.4 | 0.85 | 35.0 | 0.294 | 850 | 60 |
| Example 9 | Cu/Mg/Ti/Mg/Si₃N₄ | 0.45 | 9.4 | 1.7 | 69.9 | 0.49 | 670 | 60 |
| Example 10 | Cu/Mg/Ti/Mg/AlN | 0.45 | 9.4 | 1.7 | 69.9 | 0.49 | 850 | 60 |
| Example 11 | Cu/Ti + Mg/AlN | 0.23 | 4.8 | 0.85 | 35.0 | 0.49 | 680 | 10 |
| Example 12 | Cu/Ti + Mg/Si₃N₄ | 0.23 | 4.8 | 0.85 | 35.0 | 0.49 | 700 | 10 |
| Comparative Example 1 | Cu/Ti + Mg/AlN | 0.005 | 0.1 | 0.34 | 14.0 | 1.96 | 680 | 30 |
| Comparative Example 2 | Cu/Ti/Mg/AlN | 3.20 | 66.9 | 0.51 | 21.0 | 0.294 | 720 | 5 |
| Comparative Example 3 | Cu/Ti + Mg/AlN | 0.14 | 2.9 | 0.05 | 2.1 | 0.98 | 640 | 30 |
| Comparative Example 4 | Cu/Mg/Ti/AlN | 0.45 | 9.4 | 5.35 | 220.1 | 0.294 | 800 | 5 |
| Related Art Example 1 | Cu/Ag—Cu—Ti brazing material/AlN | 0.23 | 4.8 | — | — | 0.49 | 810 | 10 |

*"A + B" means codeposition of A and B.

TABLE 2

| | Observation result of bonding interface | | | | | Presence or | | |
|---|---|---|---|---|---|---|---|---|
| | Mg solid solution layer | Intermetallic compound phase | Active metal nitride layer | Cu particles | Cu concentration (atom %) | Initial bonding ratio % | absence of ceramic cracking | Migration |
| Example 1 | Present | Present | Present | Present | 10.8 | 95.2 | Absent | A |
| Example 2 | Present | Present | Present | Present | 7.8 | 97.6 | Absent | A |
| Example 3 | Present | Present | Present | Present | 0.3 | 96.7 | Absent | A |
| Example 4 | Present | Present | Present | Present | 14.9 | 95.0 | Absent | A |

TABLE 2-continued

| | Observation result of bonding interface | | | | Initial bonding ratio % | Presence or absence of ceramic cracking | Migration |
|---|---|---|---|---|---|---|---|
| | Mg solid solution layer | Intermetallic compound phase | Active metal nitride layer | Cu particles | Cu concentration (atom %) | | |
| Example 5 | Present | Present | Present | Present | 4.6 | 93.2 | Absent | A |
| Example 6 | Present | Present | Present | Present | 5.3 | 96.1 | Absent | A |
| Example 7 | Present | Present | Present | Present | 0.8 | 91.2 | Absent | A |
| Example 8 | Present | Present | Present | Present | 12.8 | 99.0 | Absent | A |
| Example 9 | Present | Present | Present | Present | 11.2 | 92.1 | Absent | A |
| Example 10 | Present | Present | Present | Present | 13.9 | 98.1 | Absent | A |
| Example 11 | Present | Present | Present | Present | 3.8 | 98.1 | Absent | A |
| Example 12 | Present | Present | Present | Present | 9.9 | 97.8 | Absent | A |
| Comparative Example 1 | Present | Absent | Present | Present | 0.2 | 81.5 | Absent | A |
| Comparative Example 2 | Present | Present | Present | Present | 6.7 | 97.5 | Present | A |
| Comparative Example 3 | Absent | Present | Present | Present | 0.1 | 83.5 | Absent | A |
| Comparative Example 4 | Present | Present | Present | Present | 15.4 | 97.5 | Present | A |
| Related Art Example 1 | — | Present | Present | Absent | — | 96.7 | Absent | B |

In Comparative Example 1 in which the amount of the active metal (the amount of Ti) was 0.1 µmol/cm$^2$ (0.005 mg/cm$^2$), which is smaller than that of the range of the present invention, in an active metal and Mg disposing step, the initial bonding ratio was low. It is presumed that this is because no active metal (Ti) was present as an intermetallic compound phase in the Mg solid solution layer, and the interfacial reaction was insufficient.

In Comparative Example 2 in which the amount of the active metal (the amount of Ti) was 66.9 µmol/cm$^2$ (3.20 mg/cm$^2$), which is larger than that of the range of the present invention, in the active metal and Mg disposing step, cracking of the ceramic substrate was confirmed. It is presumed that this is because a relatively hard intermetallic compound phase was formed in a large amount.

In Comparative Example 3 in which the amount of Mg was 2.1 µmol/cm$^2$ (0.05 mg/cm$^2$), which is smaller than that of the range of the present invention, in the active metal and Mg disposing step, the initial bonding ratio was low. It is presumed that this is because the Mg solid solution layer was not observed and the interfacial reaction was insufficient.

In Comparative Example 4 in which the amount of Mg was 220.1 µmol/cm$^2$ (5.35 mg/cm$^2$), which is larger than that of the range of the present invention, in the active metal and Mg disposing step, cracking of the ceramic substrate was confirmed. It is presumed that this is because the decomposition reaction of the ceramic substrate had excessively occurred, Al was excessively formed, and intermetallic compounds of these and Cu, the active metal (Ti), or Mg were formed in large amounts.

In an example in the related art in which a ceramic substrate and a copper plate are bonded to each other using a Ag—Cu—Ti brazing material, migration was determined as "B". It is presumed that this is because Ag is present at the bonding interface.

Contrary to this, in Examples 1 to 12, the initial bonding ratio was high, and no cracking was confirmed in the ceramic substrate. Also, migration was good.

As shown in FIGS. 9A, 9B, and 9C, as a result of observation of the bonding interface, an active metal nitride layer 31 (titanium nitride layer) and a Mg solid solution layer 32 were observed, dispersion of an intermetallic compound phase 33 in the Mg solid solution layer 32 was observed.

Example 2

Copper/ceramic bonded bodies having a structure shown in Table 3 were formed. Specifically, as shown in Table 3, a copper/ceramic bonded body was formed by laminating copper plates in which a simple substance of an active metal and Mg simple substance were formed into films on both surfaces of a 40 mm square ceramic substrate and bonding the laminated plates under bonding conditions shown in Table 3. The thickness of the ceramic substrate used was 0.635 mm in a case of aluminum nitride and 0.32 min in a case of silicon nitride. In addition, the degree of vacuum of the vacuum furnace at the time of bonding was 5×10$^{-3}$ Pa.

Regarding the copper/ceramic bonded bodies obtained as described above, as in Example 1, the bonding interface was observed, and an active metal nitride layer, a Mg solid solution layer, the presence or absence of an active metal in the Mg solid solution layer (presence or absence of an intermetallic compound phase), and the presence or absence of Cu particles and the Cu concentration in the active metal nitride layer were checked. In addition, the initial bonding ratio of the copper/ceramic bonded body, cracking of the ceramic substrate after thermal cycles, and migration properties were evaluated as in Example 1. The evaluation results are shown in Table 4.

TABLE 3

| | | Active metal and Mg disposing step | | | | | Bonding conditions | | |
|---|---|---|---|---|---|---|---|---|---|
| | | | Amount of active metal | | Amount of Mg | | Load | Temperature | Time |
| | Film configuration* | Element | mg/cm$^2$ | µmol/cm$^2$ | mg/cm$^2$ | µmol/cm$^2$ | MPa | °C. | min |
| Example 21 | Cu/Zr + Mg/AlN | Zr | 0.04 | 0.4 | 0.34 | 14.0 | 0.588 | 700 | 30 |
| Example 22 | Cu/Zr/Mg/AlN | Zr | 0.91 | 10.0 | 0.34 | 14.0 | 0.588 | 700 | 30 |
| Example 23 | Cu/Zr + Mg/Si$_3$N$_4$ | Zr | 2.66 | 29.2 | 0.34 | 14.0 | 0.588 | 700 | 30 |
| Example 24 | Cu/Mg/Nb/Si$_3$N$_4$ | Nb | 0.98 | 10.5 | 0.34 | 14.0 | 0.588 | 700 | 30 |
| Example 25 | Cu/Hf + Mg/AlN | Hf | 1.57 | 8.8 | 0.34 | 14.0 | 0.588 | 700 | 30 |

TABLE 3-continued

| | | Active metal and Mg disposing step | | | | | Bonding conditions | | |
|---|---|---|---|---|---|---|---|---|---|
| | | | Amount of active metal | | Amount of Mg | | Load | Temperature | Time |
| | Film configuration* | Element | mg/cm$^2$ | μmol/cm$^2$ | mg/cm$^2$ | μmol/cm$^2$ | MPa | ° C. | min |
| Example 26 | Cu/Ti + Zr + Mg/Si$_3$N$_4$ | Ti | 0.22 | 4.7 | 0.34 | 14.0 | 0.588 | 700 | 30 |
| | | Zr | 0.48 | 5.3 | | | | | |
| Example 27 | Cu/Mg/Ti + Hf/Mg/AlN | Ti | 1.00 | 20.8 | 0.34 | 14.0 | 0.588 | 700 | 30 |
| | | Hf | 4.68 | 26.2 | | | | | |
| Comparative Example 21 | Cu/Zr + Mg/AlN | Zr | 4.60 | 50.4 | 0.34 | 14.0 | 0.588 | 700 | 30 |
| Comparative Example 22 | Cu/Nb/Mg/AlN | Nb | 5.69 | 61.2 | 0.34 | 14.0 | 0.588 | 700 | 30 |
| Comparative Example 23 | Cu/Hf + Mg/AlN | Hf | 0.04 | 0.2 | 0.34 | 14.0 | 0.588 | 700 | 30 |
| Comparative Example 24 | Cu/Mg/Hf + Nb/Si$_3$N$_4$ | Hf | 0.02 | 0.1 | 0.34 | 14.0 | 0.588 | 700 | 30 |
| | | Nb | 0.01 | 0.1 | | | | | |

*"A + B" means codeposition of A and B.

TABLE 4

| | Observation result of bonding interface | | | | | | | Presence or | |
|---|---|---|---|---|---|---|---|---|---|
| | Mg solid solution layer | Presence or absence of active metal | Intermetallic compound phase | Active metal nitride layer | Cu particles | Cu concentration (at %) | Initial bonding ratio % | absence of ceramic cracking | Migration |
| Example 21 | Present | Present | Present | Present | Present | 5.1 | 96.7 | Absent | A |
| Example 22 | Present | Present | Present | Present | Present | 5.2 | 97.1 | Absent | A |
| Example 23 | Present | Present | Present | Present | Present | 4.6 | 95.4 | Absent | A |
| Example 24 | Present | Present | — | Present | Present | 5.0 | 97.5 | Absent | A |
| Example 25 | Present | Present | Present | Present | Present | 4.7 | 96.1 | Absent | A |
| Example 26 | Present | Present | Present | Present | Present | 5.5 | 95.6 | Absent | A |
| Example 27 | Present | Present | Present | Present | Present | 5.0 | 97.9 | Absent | A |
| Comparative Example21 | Present | Present | Present | Present | Present | 6.1 | 96.4 | Present | A |
| Comparative Example22 | Present | Present | — | Present | Present | 6.4 | 95.2 | Present | A |
| Comparative Example23 | Present | Absent | Absent | Present | Present | 0.1 | 83.6 | Absent | A |
| Comparative Example24 | Present | Absent | Absent | Present | Present | 0.2 | 82.5 | Absent | A |

In Comparative Example 21 in which the amount of the active metal (the amount of Zr) was 50.4 μmol/cm$^2$, which is larger than that of the range of the present invention, and Comparative Example 22 in which the amount of the active metal (the amount of Nb) was 61.2 μmol/cm$^2$, which is larger than that of the range of the present invention, in an active metal and Mg disposing step, cracking of the ceramic substrate was confirmed. It is presumed that this is because the amount of the active metal present in the Mg solid solution layer was large and the Mg solid solution layer became hard.

In Comparative Example 23 in which the amount of the active metal (the amount of Hf) was 0.2 μmol/cm$^2$, which is smaller than that of the range of the present invention, and Comparative Example 24 in which the amount of the active metal (the amount of Hf+Nb) was 0.2 μmol/cm$^2$, which is smaller than that of the range of the present invention, in the active metal and Mg disposing step, the initial bonding ratio was low.

Contrary to this, in Examples 21 to 27, the initial bonding ratio was high, and no cracking was confirmed in the ceramic substrate. Also, migration was good.

From the above description, according to the examples, it was confirmed that it is possible to provide a copper/ceramic bonded body (insulating circuit substrate) in which a copper member and a ceramic member are reliably bonded to each other and excellent migration resistance is achieved.

Example 3

An insulating circuit substrate having a structure shown in Table 5 was formed. Specifically, as shown in Table 5, an insulating circuit substrate having a circuit layer was formed by laminating copper plates in which a simple substance of an active metal and Mg simple substance were formed into films on both surfaces of a 40 mm square ceramic substrate and bonding the laminated plates under bonding conditions shown in Table 5. The thickness of the ceramic substrate used was 0.635 mm in a case of aluminum nitride and 0.32 mm in a case of silicon nitride. In addition, the degree of vacuum of the vacuum furnace at the time of bonding was 5×10$^{-3}$ Pa.

For the insulating circuit substrate obtained as described above, the area ratio of a Cu$_2$Mg phase at the bonding interface between the ceramic substrate and the circuit layer, and the pull strength of a terminal ultrasonically bonded to the circuit layer were evaluated as follows.

(Area Ratio of Cu$_2$Mg Phase)

Regarding the bonding interface between the copper plate and the ceramic substrate, the element map of Mg of a region (120 μm×160 μm) including the bonding interface was acquired under the conditions of a magnification of 750 times and an accelerating voltage of 15 kV using the electron probe microanalyzer (JXA-8539F manufactured by JEOL Ltd.), and a region satisfying that the Mg concentration as a five-point average of quantitative analysis in the region where the presence of Mg was confirmed was 30 at % or more and 40 at % or less was regarded as a $Cu_2Mg$ phase.

In an observation visual field, an area A of a region from the bonding surface of the ceramic substrate to 50 μm toward the copper plate side from the bonding surface of the ceramic substrate was obtained. An area B of the $Cu_2Mg$ phase was obtained in this region, and the area ratio B/A× 100 (%) of the $Cu_2Mg$ phase was obtained. As described above, the area ratio of the $Cu_2Mg$ phase was measured in five visual fields, and the average value thereof is described in Table 5.

(Pull Strength)

Figure 10A:
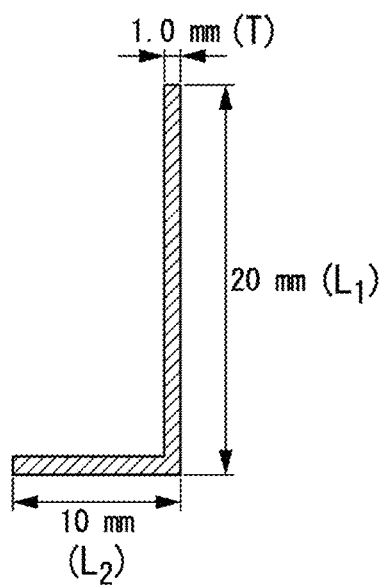
FIG. 10A is an explanatory view showing a method for measuring a pull strength in Example 3.
Figure 10B:
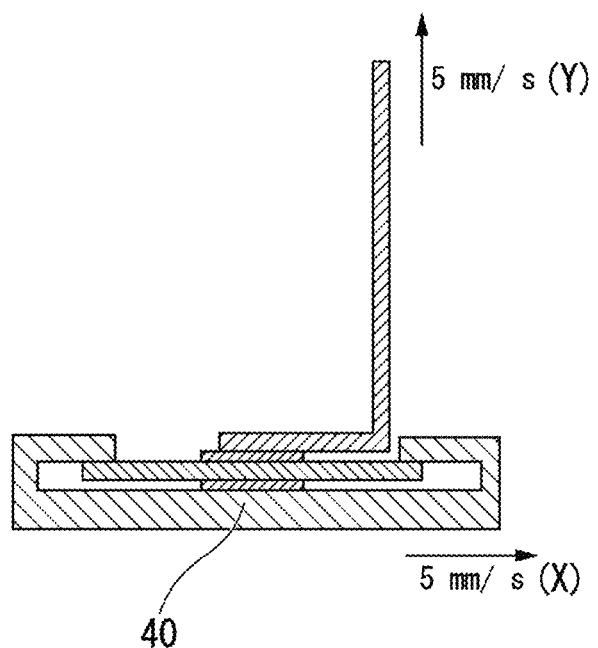
FIG. 10B is an explanatory view showing a method for measuring a pull strength in Example 3.

As shown in FIGS. 10A and 10B, using an ultrasonic metal bonder (60C-904 manufactured by Ultrasonic Engineering Co., Ltd.) including a stage 40, a copper terminal (width: 5 mm, thickness T: 1.0 mm, length L1: 20 mm, length L2: 10 mm) was ultrasonically bonded to the circuit layer of the insulating circuit substrate under the condition of a collapse amount of 0.3 mm.

A value obtained by dividing the breaking load when the copper terminal was pulled under the conditions of a tool speed Y of 5 mm/s and a stage speed X of 5 mm/s by the bonding area was described as the pull strength in Table 5.

12, 112: circuit layer
13, 113: metal layer
22, 23, 122: copper plate
31, 131: active metal nitride layer
32, 132: Mg solid solution layer
33, 133: intermetallic compound phase
35, 135: Cu particles

The invention claimed is:

1. A copper/ceramic bonded body in which a copper member made of copper or a copper alloy and a ceramic member made of aluminum nitride or silicon nitride are bonded to each other,
   wherein an active metal nitride layer containing a nitride of one or more active metals selected from Ti, Zr, Nb, and Hf is formed on the ceramic member side between the copper member and the ceramic member,
   a Mg solid solution layer in which Mg is dissolved in a Cu matrix phase is formed between the active metal nitride layer and the copper member, and
   the active metal is present in the Mg solid solution layer.

2. The copper/ceramic bonded body according to claim 1, wherein an intermetallic compound phase containing Cu and the active metal is dispersed in the Mg solid solution layer.

TABLE 5

| | | Active metal and Mg disposing step | | | | | Bonding conditions | | | Area ratio of $Cu_2Mg$ phase | Pull strength |
| --- | --- | --- | --- | --- | --- | --- | --- | --- | --- | --- | --- |
| | | | Amount of active metal | | Amount of Mg | | Load | Temperature | Time | | |
| | Film configuration* | Element | mg/cm² | μmol/cm² | mg/cm² | μmol/cm² | MPa | °C. | min | (%) | MPa |
| Example 31 | Cu/Ti + Mg/AlN | Ti | 0.14 | 2.9 | 0.51 | 21.0 | 0.049 | 700 | 30 | 12.8 | 2.15 |
| Example 32 | Cu/Ti + Mg/AlN | Ti | 0.14 | 2.9 | 0.51 | 21.0 | 0.049 | 700 | 180 | 6.0 | 2.38 |
| Example 33 | Cu/Ti + Mg/AlN | Ti | 0.14 | 2.9 | 0.51 | 21.0 | 0.049 | 700 | 60 | 9.4 | 2.23 |
| Example 34 | Cu/Mg/Zr/Si₃N₄ | Zr | 1.72 | 18.8 | 0.90 | 37.0 | 0.490 | 800 | 60 | 1.2 | 2.53 |
| Example 35 | Cu/Mg/Ti + Zr/Si₃N₄ | Ti | 0.14 | 2.9 | 0.90 | 37.0 | 0.490 | 850 | 240 | 0.1 | 2.57 |
| | | Zr | 0.21 | 2.3 | | | | | | | |
| Example 36 | Cu/Mg/Ti/AlN | Ti | 0.75 | 15.6 | 0.76 | 31.4 | 0.294 | 700 | 30 | 15.0 | 2.02 |
| Example 37 | Cu/Mg/Ti/AlN | Ti | 0.13 | 2.8 | 0.76 | 31.4 | 0.294 | 750 | 30 | 11.5 | 2.21 |
| Example 38 | Cu/Ti/Mg/AlN | Ti | 0.20 | 4.2 | 0.51 | 21.0 | 1.960 | 720 | 360 | 0.7 | 2.49 |
| Example 39 | Cu/Ti/Mg/AlN | Ti | 0.20 | 4.2 | 0.51 | 21.0 | 1.960 | 720 | 120 | 7.3 | 2.25 |
| Example 40 | Cu/Mg + Nb/Si₃N₄ | Nb | 0.26 | 2.8 | 0.21 | 8.8 | 0.294 | 700 | 60 | 3.6 | 2.53 |
| Example 41 | Cu/Mg + Hf/Si₃N₄ | Hf | 0.62 | 3.5 | 0.27 | 11.3 | 0.294 | 680 | 20 | 20.2 | 1.29 |
| Example 42 | Cu/Mg + Ti + Hf/Si₃N₄ | Ti | 0.31 | 6.4 | 0.27 | 11.3 | 0.294 | 600 | 360 | 18.9 | 1.60 |
| | | Hf | 0.68 | 3.8 | | | | | | | |
| Example 43 | Cu/Ti/Mg/AlN | Ti | 2.25 | 47.0 | 0.51 | 21.0 | 1.960 | 720 | 5 | 24.7 | 1.07 |

*"A + B" means codeposition of A and B.

It was confirmed from comparison between Examples 31 to 43 that the lower the area ratio of the $Cu_2Mg$ phase, the higher the pull strength. Therefore, it was confirmed that in a case of improving ultrasonic bonding properties, it is effective to limit the area ratio of the $Cu_2Mg$ to a low value.

INDUSTRIAL APPLICABILITY

According to the present invention, it is possible to provide a copper/ceramic bonded body in which a copper member and a ceramic member are reliably bonded to each other and excellent migration resistance is achieved, an insulating circuit substrate, a method for producing the copper/ceramic bonded body, and a method for producing an insulating circuit substrate.

REFERENCE SIGNS LIST

10, 110: insulating circuit substrate
11, 111: ceramic substrate

3. The copper/ceramic bonded body according to claim 1, wherein Cu particles are dispersed in the active metal nitride layer.

4. The copper/ceramic bonded body according to claim 1, wherein the active metal is Ti.

5. The copper/ceramic bonded body according to claim 1, wherein, in a region from a bonding surface of the ceramic member to 50 μm toward the copper member side between the ceramic member and the copper member, an area ratio of a $Cu_2Mg$ phase is 15% or less.

6. An insulating circuit substrate in which a copper plate made of copper or a copper alloy is bonded to a surface of a ceramic substrate made of aluminum nitride or silicon nitride,
   wherein an active metal nitride layer containing a nitride of one or more active metals selected from Ti, Zr, Nb, and Hf is formed on the ceramic substrate side between the copper plate and the ceramic substrate, a Mg solid solution layer in which Mg is dissolved in a Cu matrix phase is formed between the active metal nitride layer and the copper plate, and the active metal is present in the Mg solid solution layer.

7. The insulating circuit substrate according to claim 6, wherein an intermetallic compound phase containing Cu and the active metal is dispersed in the Mg solid solution layer.

8. The insulating circuit substrate according to claim 6, wherein Cu particles are dispersed in the active metal nitride layer.

9. The insulating circuit substrate according to claim 6, wherein the active metal is Ti.

10. The insulating circuit substrate according to claim 6, wherein, in a region from a bonding surface of the ceramic substrate to 50 μm toward the copper plate side between the ceramic substrate and the copper plate, an area ratio of a $Cu_2Mg$ phase is 15% or less.

11. The copper/ceramic bonded body according to claim 2, wherein Cu particles are dispersed in the active metal nitride layer.

12. The copper/ceramic bonded body according to claim 2, wherein the active metal is Ti.

13. The copper/ceramic bonded body according to claim 2, wherein, in a region from a bonding surface of the ceramic member to 50 μm toward the copper member side between the ceramic member and the copper member, an area ratio of a $Cu_2Mg$ phase is 15% or less.

14. The insulating circuit substrate according to claim 7, wherein Cu particles are dispersed in the active metal nitride layer.

15. The insulating circuit substrate according to claim 7, wherein the active metal is Ti.

16. The insulating circuit substrate according to claim 7, wherein, in a region from a bonding surface of the ceramic substrate to 50 μm toward the copper plate side between the ceramic substrate and the copper plate, an area ratio of a $Cu_2Mg$ phase is 15% or less.

17. A method for producing a copper/ceramic bonded body, for producing the copper/ceramic bonded body according to claim 1, the method comprising:

an active metal and Mg disposing step of disposing one or more active metals selected from Ti, Zr, Nb, and Hf and Mg between the copper member and the ceramic member;

a laminating step of laminating the copper member and the ceramic member with the active metal and the Mg interposed therebetween; and a bonding step of performing a heating treatment on the copper member and the ceramic member laminated with the active metal and the Mg interposed therebetween in a state of being pressed in a laminating direction under a vacuum atmosphere so as to bond the copper member and the ceramic member to each other, wherein, in the active metal and Mg disposing step, an active metal amount is 0.4 μtmol/cm$^2$ or more and 47.0 μtmol/cm$^2$ or less, and a Mg amount is 7.0 μtmol/cm$^2$ or more and 143.2 μtmol/cm$^2$ or less.

18. The method for producing a copper/ceramic bonded body according to claim 17, wherein a pressing load in the bonding step is 0.049 MPa or more and 3.4 MPa or less, and a heating temperature in the bonding step is 500° C. or higher and 850° C. or lower in a case where Cu of the copper member and Mg are laminated in a contact state and is 670° C. or higher and 850° C. or lower in a case where the Cu and the Mg are laminated in a non-contact state.

19. A method for producing an insulating circuit substrate, for producing the insulating circuit substrate according to claim 6, in which the copper plate made of copper or copper alloy is bonded to the surface of the ceramic substrate made of aluminum nitride or silicon nitride, the method comprising:

an active metal and Mg disposing step of disposing one or more active metals selected from Ti, Zr, Nb, and Hf and Mg between the copper plate and the ceramic substrate;

a laminating step of laminating the copper plate and the ceramic substrate with the active metal and the Mg interposed therebetween; and a bonding step of performing a heating treatment on the copper plate and the ceramic substrate laminated with the active metal and the Mg interposed therebetween in a state of being pressed in a laminating direction under a vacuum atmosphere so as to bond the copper plate and the ceramic substrate to each other, wherein, in the active metal and Mg disposing step, an active metal amount is 0.4 μtmol/cm$^2$ or more and 47.0 μtmol/cm$^2$ or less, and a Mg amount is 7.0 μtmol/cm$^2$ or more and 143.2 μtmol/cm$^2$ or less.

20. The method for producing an insulating circuit substrate according to claim 19, wherein a pressing load in the bonding step is 0.049 MPa or more and 3.4 MPa or less, a heating temperature in the bonding step is 500° C. or higher and 850° C. or lower in a case where Cu of the copper plate and Mg are laminated in a contact state and is 670° C. or higher and 850° C. or lower in a case where the Cu and the Mg are laminated in a non-contact state.

* * * * *